United States Patent
Aoyama et al.

[11] Patent Number: 5,877,622
[45] Date of Patent: Mar. 2, 1999

[54] CONNECTOR EXAMINATION DEVICE FOR DETERMINING A CONNECTION IN A CONNECTOR

[75] Inventors: Masahiko Aoyama; Eiji Saijo; Keigo Atsumi, all of Yokkaichi, Japan

[73] Assignee: Sumitomo Wiring Systems, Ltd., Yokkaichi, Japan

[21] Appl. No.: 787,222

[22] Filed: Jan. 22, 1997

Related U.S. Application Data

[62] Division of Ser. No. 401,443, Mar. 9, 1995, Pat. No. 5,614,820.

[30] Foreign Application Priority Data

| Mar. 10, 1994 | [JP] | Japan | 6-67829 |
| Mar. 10, 1994 | [JP] | Japan | 6-67830 |
| Mar. 14, 1994 | [JP] | Japan | 6-70131 |
| Apr. 21, 1994 | [JP] | Japan | 6-107962 |

[51] Int. Cl.⁶ .................................................. G01R 1/06
[52] U.S. Cl. ...................... 324/158.1; 324/538; 324/754; 324/761
[58] Field of Search ................... 324/72.5, 754, 324/537, 538, 761; 439/182, 482, 488–489, 310; 29/593, 591

[56] References Cited

U.S. PATENT DOCUMENTS

| 4,232,262 | 11/1980 | Emo et al. | 324/754 |
| 4,658,212 | 4/1987 | Ozawa et al. | 324/72.5 |
| 4,902,968 | 2/1990 | Sugimoto | 324/538 |
| 5,030,906 | 7/1991 | Duff | 324/762 |
| 5,455,515 | 10/1995 | Saijo et al. | 324/538 |
| 5,467,023 | 11/1995 | Takeyama | 324/754 |
| 5,481,204 | 1/1996 | Aikawa | 324/538 |
| 5,512,833 | 4/1996 | Fukuda et al. | 324/538 |
| 5,586,900 | 12/1996 | Yagi et al. | 439/310 |

FOREIGN PATENT DOCUMENTS

| 1-150 828 | 6/1989 | Japan . |

*Primary Examiner*—Vinh P. Nguyen
*Attorney, Agent, or Firm*—Oliff & Berridge, PLC

[57] ABSTRACT

A connector examining system includes a mechanism to move a terminal into a proper insertion position and to determine if the terminal is in the proper insertion position. The system includes a probe holder, a connector holder, and terminal pushing member. Resilient members assure that the connector is moved to a position where the terminal is properly positioned. A connector has its orientation corrected by a tapered surface of the probe holder. The connector housing includes a lance which projects into a cavity and is elastically deformable toward a lance flexure space by the metal terminal inserted into the cavity. A lance of the connector assures that the terminal is retained in the connector. The metal terminal optionally has stabilizers positioned on opposite sides of the lance. A check pin of the probe holder, which is insertable into the lance flexure space, optionally has a front end check portion pivotally movable toward the stabilizers.

7 Claims, 18 Drawing Sheets

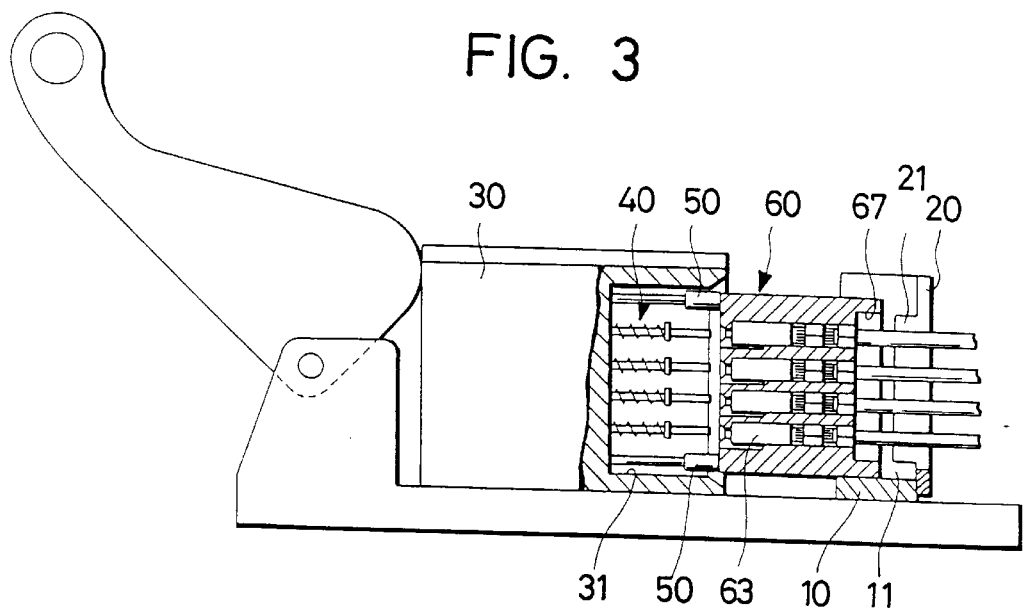
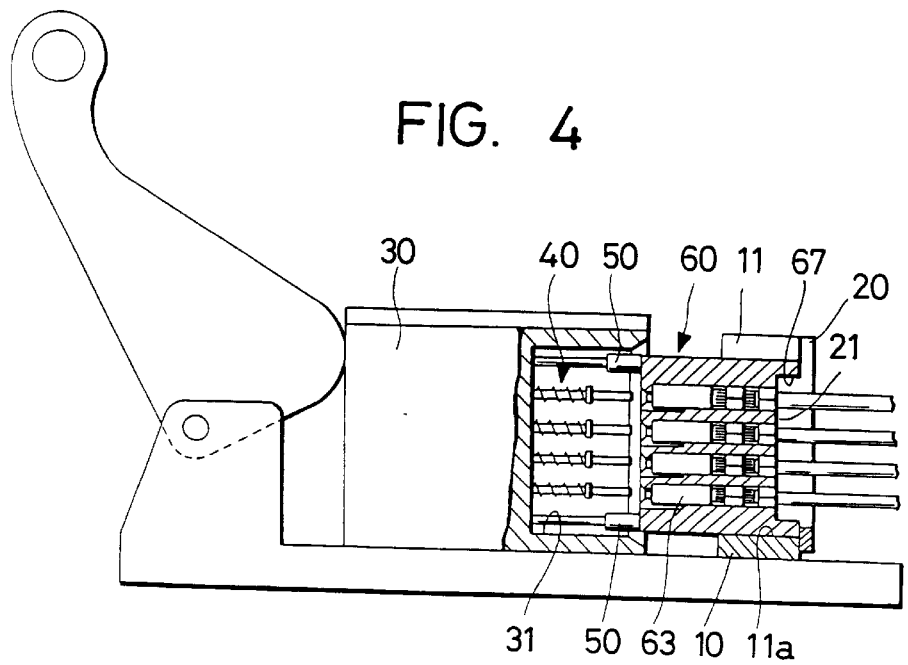

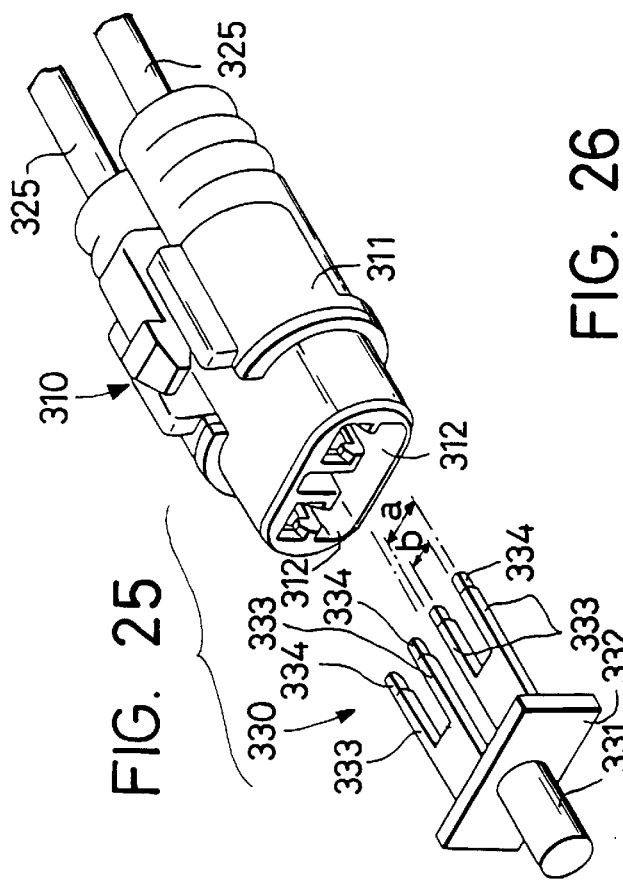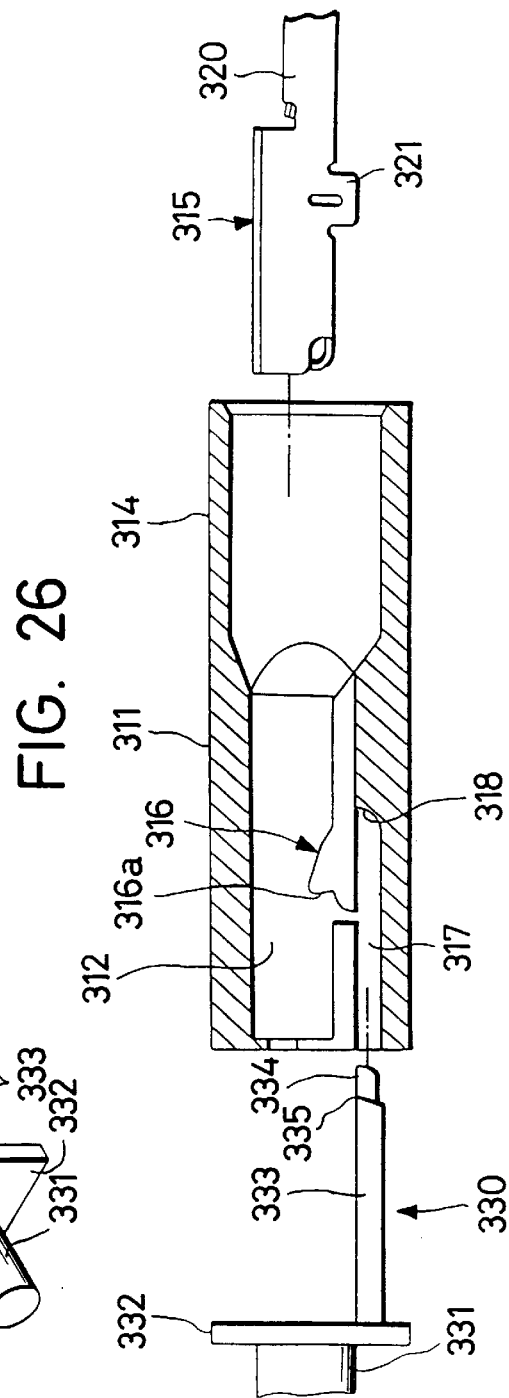

CONNECTOR EXAMINATION DEVICE FOR DETERMINING A CONNECTION IN A CONNECTOR

This is a Division of application Ser. No. 08/401,443 filed Mar. 9, 1995, now U.S. Pat. No. 5,614,820.

BACKGROUND OF THE INVENTION

1. Field of the Invention

This invention relates to a connector examination device. In particular, the connector examination device examines a connector having metal terminals inserted therein and determines whether or not there is an electrical connection established between the metal terminals. The connector examination device also detects the inserted condition of metal terminals in a connector housing and an improper attachment of metal terminals inserted into a connector housing.

2. Related Art

Generally, a connector assembly comprises a connector housing constructed of a synthetic resin. Metal terminals, secured to ends of wires, are inserted in the housing. When a metal terminal is inserted into a proper insertion position, the metal terminal is retained against withdrawal by a lance or retaining pawl provided on the metal terminal or the connector housing. In a connector of this type, if the metal terminal is not attached in the proper insertion position, so that it is not retained against withdrawal by the lance, the possibility exists that the metal terminal can be withdrawn during use. Therefore, it is necessary to first check for a proper insertion and correct the insertion if it is improper.

Previously, a conventional method has been used to check for proper insertion. A retainer is used in combination with lances. The retainer engages a metal terminal inserted into the proper position and cooperates with the lance to form a double retaining means. Before the metal terminals are inserted, the retainer is initially retained at a position where it will not interfere with the insertion of connector and the metal terminals. The metal terminals are inserted and the retainer is moved into a completely retained position to engage the metal terminals.

If any one of the metal terminals fails to reach the properly inserted position, so that it is disposed in an improper inserted position, the retainer is caught by the metal terminal during movement of the retainer into the completely retained position, so the retainer can not be moved into the completely retained position.

Therefore, by determining whether or not the retainer can be moved into the completely retained position, it can also be ascertained whether or not the metal terminals have been inserted to the proper position. If it is determined that the metal terminal has not been inserted to the proper position, the metal terminal insertion operation is carried out again.

In this conventional method, the retainer, fit in the completely retained position, is not removed from the connector and the connector must be used with the retainer fit into the connector. Therefore, an equal number of retainers and connector housings are required. Thus, the number of the component parts is unnecessarily high, which in turn creates a high cost.

Furthermore, the retainer only determines whether or not any improperly inserted metal terminal exists. If it is determined that there exists an improperly inserted metal terminal, the metal terminal must be pushed deeper into the connector or the insertion of the metal terminal must be carried again to correct the position of the terminal. The insertion condition of the metal terminals must be re-checked. Therefore, much time and labor is required. Further, if the metal terminal is disposed in an improper position near to the proper inserted position, it can not be clearly and readily determined from the appearance alone if the metal terminal is in an improper position. Thus, the position of all of the metal terminals must be corrected. Particularly, in the case of a multi-pole connector having many metal terminals, the correction of all the terminals requires much time and labor to correct the position of the metal terminals. Therefore, the problem that the efficiency of the metal terminal insertion operation is low has been encountered.

Previously, there have been proposed various kinds of connector examination devices for detecting incomplete insertion of metal terminals. One example of a known connector examination device is shown in FIG. 22. In this device, lance check pins 206 extend and oppose lances 203 in a connector 201. Each lance check pin 206 is inserted into a lance flexure space 204 formed in a connector housing 202. If a metal terminal 205 is completely inserted into a proper position, when the lance check pin 206 is inserted into the lance flexure space 204, it does not abut against the lance 203. The lance check pin 206 advances to a position beneath the lance 203, as shown in FIG. 23. If the metal terminal 205 is in an incomplete inserted condition, the lance check pin 206 abuts against the front end portion of the lance 203 projected substantially into the lance flexure space 204 and elastically deforms. In this arrangement, the lance 203 projects substantially into the lance flexure space 204. Because of the improper attachment of the metal terminal 205, the lance check pin 206 abuts against the front end of the lance 203. Hence, the lance check pin 206 can not move to the position beneath the lance 203. As a result, the insertion of the metal terminal 205 is incomplete.

In this conventional connector, the lance 203 has a large thickness so that it has an elastic restoring force and a strength for retaining the metal terminal against withdrawal. A metal terminal support portion 208, which is provided between the lance flexure space 204, and a cavity 207, which receives the metal terminal 205, need to have only sufficient strength to maintain the positioning of the metal terminal 205. Therefore, the thickness of the support portion 208 is less than the thickness of the lance 203. Even when the metal terminal 205 is completely inserted in the proper position, the lance 203 projects slightly toward the lance flexure space 204 beyond the metal terminal support portion 208.

The thickness of a front end portion 206a of the lance check pin 206 is less than the inner dimension of the lance flexure space 204 so that the front end portion 206a can be positioned beneath the lance 203. When the lance check pin 206 is initially inserted into the lance flexure space 204, a gap forms between the front end portion 206a of the lance check pin 206 and the metal terminal support portion 208.

However, in the known device described above, the lance check pin 206 can be inserted into the lance flexure space 204, with its front end portion 206a bent or deformed and the lance check pin 206 obliquely advances in the space 204. In this case, even if the metal terminal 205 is completely inserted into the proper position, with the lance 203 retracted from the lance flexure space 204, the front end portion 206a of the lance check pin 206 abuts against the portion of the lance 203 extending into the lance flexure space 204, as shown in FIG. 24. As a result, even though the metal terminal 205 is disposed in the proper position, the front end portion 206a of the lance check pin 206 can not be brought into the position beneath the lance 203. As a result, a wrong determination that the metal terminal 205 is in an incompletely attached condition is possible.

Another example of known devices is disclosed in Japanese Utility Model Examined Publication No. 62-47093. In this device, a connector holder for holding a connector in a predetermined position is provided with lance check pins projected in an opposed relation to lances in the connector. Each of the lance check pins extends toward an associated lance flexure space. Each lance check pin contacts the front end of the lance disposed in a lance flexure space when an associated metal terminal is in an improperly inserted position. In this device, if a metal terminal is improperly attached, so the lance is disposed in the lance flexure space, the lance check pin abuts against the front end of the lance when the connector is set in the connector holder. The connector can not be properly set in the connector holder. Thus, the improper attachment of the metal terminal can be determined.

In the above device, however, if the connector is forced into the connector holder, though the metal terminal is disposed in an improperly attached condition, the front end of the lance check pin abuts against the lance with a force large enough that a lance made of a synthetic resin is deformed. When deformation occurs, not only is the improper attachment of the metal terminal undetected, but the lance is also damaged. Thus, the connector is rendered unusable.

SUMMARY OF THE INVENTION

This invention provides a connector assembly in which the number of component parts is reduced to reduce the cost, and in which a metal terminal insertion operation can be efficiently effected by providing the movement of a metal terminal, which is initially disposed in an improper insertion position, into a proper insertion position, where moving the metal terminal to the proper insertion position can be positively out carried.

This invention also provides a device in which an examination for electrical conduction through a wire harness can be carried out at the same time and in which probes used for this conduction examination are protected.

This invention further provides a device where, even if a connector held by a connector holder is not positioned in a proper orientation, the connector can be correctly placed into the proper orientation.

This invention additionally provides a device where a metal terminal in an improper insertion position can be moved into a proper insertion position.

This invention further provides a device where the condition of a metal terminal, whether properly or improperly inserted, can be accurately determined with a high reliability.

This invention also provides a connector examination method where an improper attachment of a metal terminal can be positively determined and enable a highly-reliable examination of the attachment condition, while preventing the lances from being damaged.

The connector examination device examines a connector having at least one terminal, where the terminal may or may not be in a proper position. The device includes a base, a terminal member insertion means mounted on the base and engageable with a terminal for moving the terminal into its proper position, a connector pushing means also mounted on the base for pushing the connector against the terminal member insertion means, and moving means mounted on the base for moving at least one of the terminal member insertion means and the connector pushing means relative to each other. The moving means may move either the terminal member insertion means or the connector pushing means or both of the terminal member insertion means and connector pushing means relative to each other. The moving means includes a handle mounted on the base.

The terminal member insertion means includes a connector holder, where the connector is inserted into the connector holder. The connector pushing means includes at least one probe insertable into the connector contacting or corresponding terminal member of the connector when the terminal is in the proper position. The probe is mounted in the connector pushing means in a probe holder.

The connector examination device may also include an indication means for indicating the insertion state of a terminal in the connector by completing an electric circuit path indicating the properly inserted position of a terminal.

These and other features and advantages of the invention are described in or apparent from the following Detailed Description of the Preferred Embodiments.

BRIEF DESCRIPTION OF THE DRAWINGS

The invention is described in detail with reference to the following drawings, wherein:

FIG. 3 is a cross sectional side view of the first embodiment showing a position where the connector pushing members are abutted against a connector;

FIG. 4 is a cross sectional side elevational view of the first embodiment showing a position where the connector pushing members move the connector to a retracted position to correct the position of metal terminals;

FIG. 25 is a perspective view of a sixth embodiment of an examination jig of the invention;

FIG. 26 is a cross sectional view of the sixth embodiment;

DETAILED DESCRIPTION OF PREFERRED EMBODIMENTS

Embodiment 1

Figure 1:
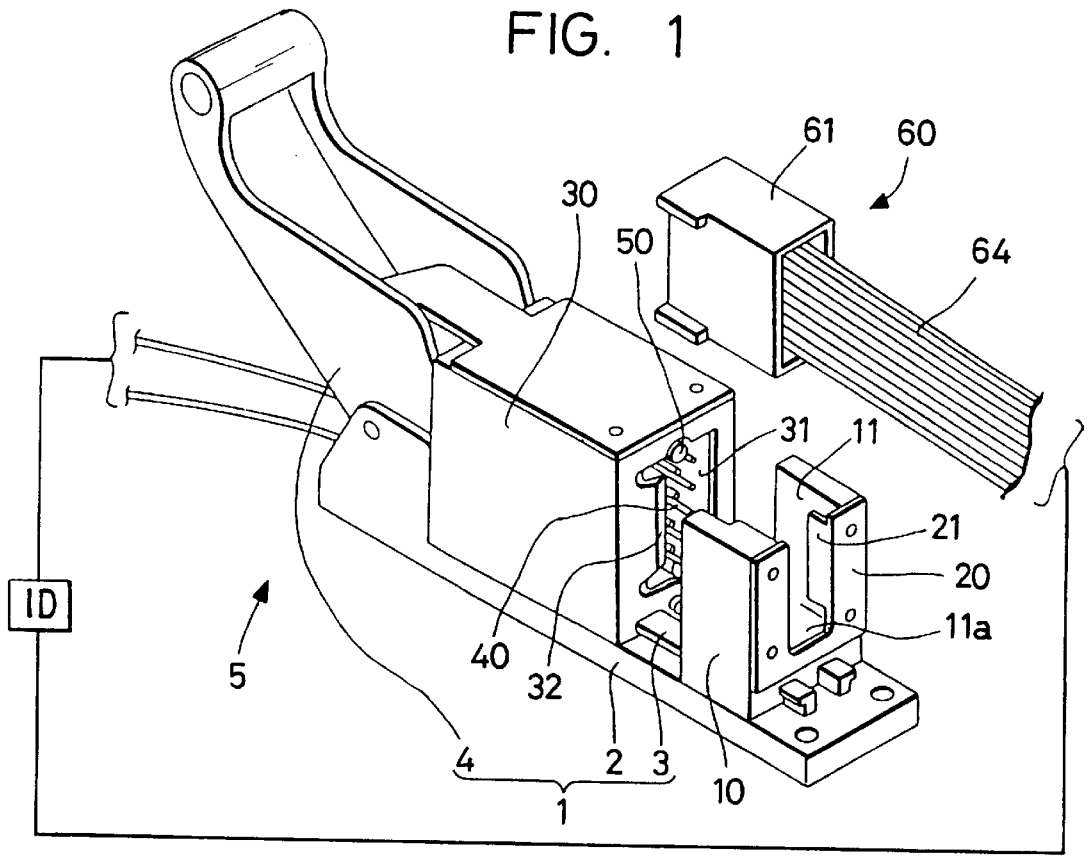
FIG. 1 is a perspective view of a first embodiment of the invention.

FIGS. 1–7 show a first preferred embodiment of the invention. As shown in FIG. 1, a connector examination device 5 comprises a moving mechanism 1, having one or more rails 3 and a cam handle 4 mounted on a base plate 2. A connector guide 10 is fixedly mounted on the base plate 2. A metal terminal pushing member 20 is integrally mounted on the connector guide 10. A probe holder 30 is movable toward and away from the connector guide 10 by pivotably moving the cam handle 4, and is guided by the rails 3. One or more probes 40 are mounted in the probe holder 30. One or more connector-pushing members 50 are also mounted on the probe holder 30.

Figure 2:
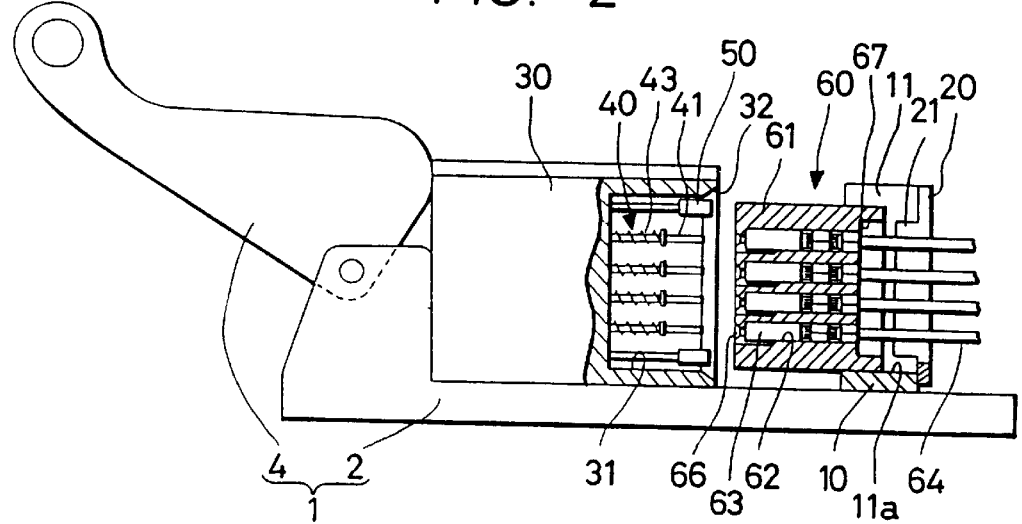
FIG. 2 is a cross sectional side view of the first embodiment showing the position before examination.

A connector 60, which is held by the connector guide 10, comprises a connector housing 61 constructed from a synthetic resin material. As shown in FIG. 2, metal female terminals 63 are respectively inserted into a plurality of cavities 62 provided in the connector housing 61. Each cavity 62 opens to the front and the rear end faces of the connector housing 61.

One or more entrance ports 66, through which the metal male terminals of a mating connector (not shown) and the probes 40 are inserted into the cavities 62, are formed in the front end face of the connector housing 61 and open to the cavities 62. The rear end face of the connector housing 61 has a large opening defining a peripheral edge portion. This opening serves as an insertion port 67 communicating with all of the cavities 62. The insertion port 67 is a space having a predetermined depth.

The cavities 62 in the connector housing 61 are arranged into two horizontally adjacent rows. Each row of cavities 62 extends in a vertical direction. A metal terminal 63 is inserted into the associated cavity 62 through the insertion port 67. A wire 64, which is fixedly secured to the metal terminal 63, extends rearwardly from the connector housing 61. When the metal terminal 63 is inserted into a proper position in the cavity 62, a lance (not shown) provided in the cavity 62 engages a retaining portion (not shown) formed on the metal terminal to retain the metal terminal 63 against being withdrawn.

If the metal terminal 63 is inserted to an improper inserted position short of the proper position, the lance will not be able to prevent the withdrawal of the metal terminal 63. Therefore, in this situation the metal terminal 63 may be withdrawn from the cavity 62. In this situation, the position of the metal terminal 63 is moved into the proper inserted position by the correction examination device 5.

The connector guide 10 is made of a synthetic resin material having a self-lubricating property, such as Juracon®. The guide 10 has a U-shaped cross-section to define an open space relative to its front, rear and top faces. The open space of the connector guide 10 serves as a holder portion 11 for holding the connector 60. A lower surface of the connector 60 is brought into contact with a bottom surface 11a of the holder portion 11. In this condition, the connector 60 is guided along the bottom surface 11a. Thus, the connector can be smoothly moved in a longitudinal direction without being moved in a lateral direction.

The metal terminal pushing member 20 has a U-shaped cross section similar to that of the connector guide 10. The metal terminal pushing member 20 is fixedly secured to a rear end surface of the connector guide 10. The metal terminal pushing member 20 has a pair of plate-like pushing portions 21 projecting into the holder portion 11 beyond edges of side walls of the holder portion 11. The pushing portions 21 enter the insertion port 67 in the connector 60 when the connector 60 is in the holder portion 11. When the connector 60 is disposed in its utmost retracted position with its rear end abutting against the metal terminal pushing member 20, the front ends of the pushing portions 21 abut against the rear ends of the metal terminals 63 disposed in the proper inserted position. Therefore, if any metal terminal 63 is inserted into an improper position, at least one of the pushing portions 21 abuts against this improperly inserted metal terminal 63 so the connector 60 is disposed forwardly of the utmost retracted position, and is thus spaced apart from the metal terminal pushing member 20. When the connector 60 is moved rearwardly, with the improperly inserted metal terminal 63 abutting against the pushing portion 21, the improperly inserted metal terminal 63 is pushed by the pushing portion 21 relative to the connector 60. Simultaneously, when the connector 60 reaches the utmost retracted position, this metal terminal 63 reaches the proper inserted position.

Figure 5:
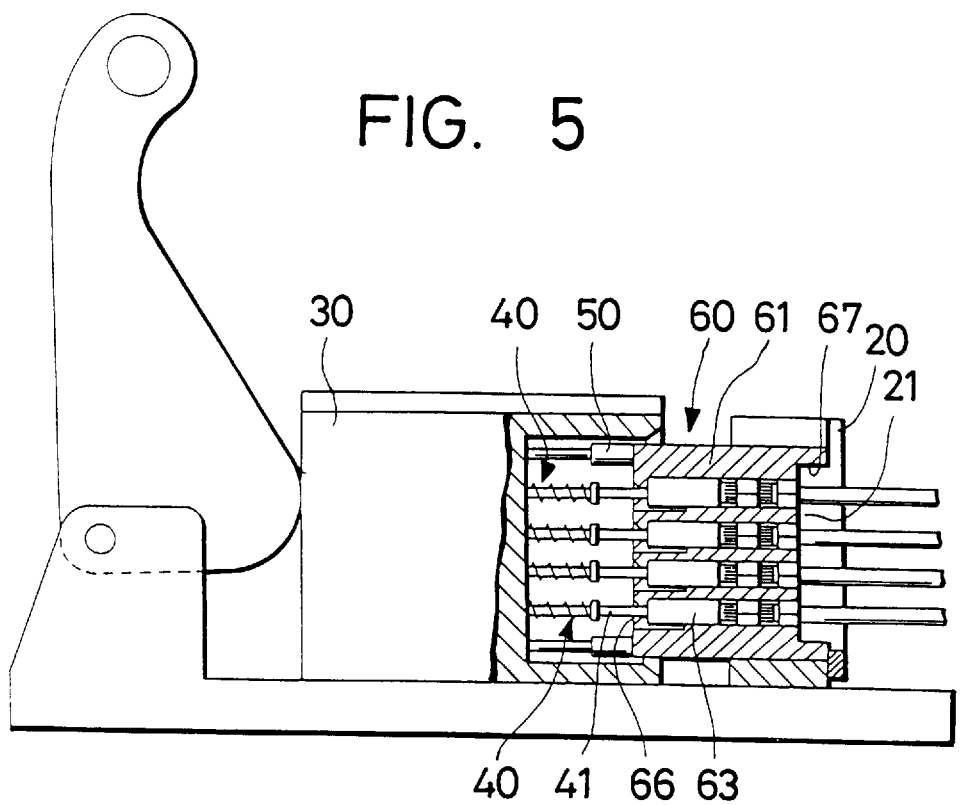
FIG. 5 is a cross sectional side view of the first embodiment showing a position where probes contact the metal terminals for a conduction examination.
Figure 6:
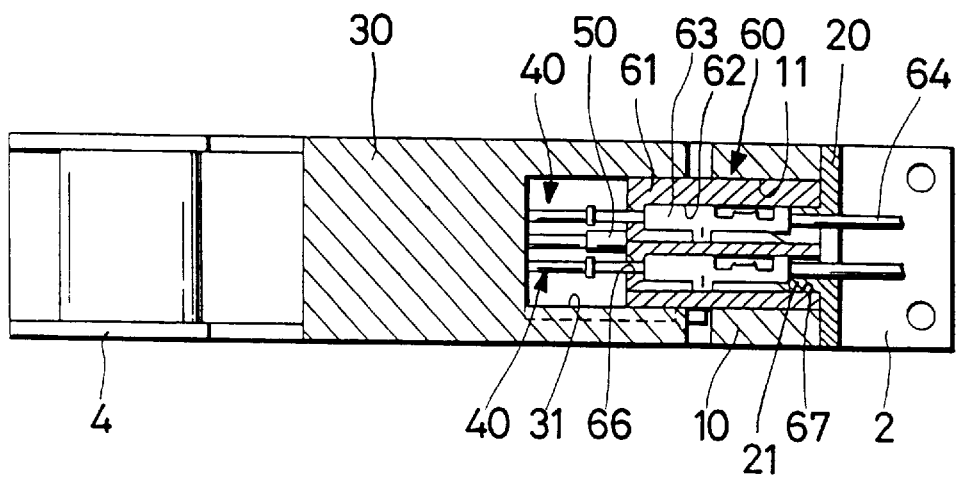
FIG. 6 is a cross sectional top view of the first embodiment showing the same position as in FIG. 5.

By pivotably moving the cam handle 4, the probe holder 30 moves between a stand-by position, as shown in FIG. 2, where the probe holder 30 is separated from the connector guide 10, and an examination position, as shown in FIG. 5, where the probe holder 30 is positioned a predetermined distance from the connector guide 10. The probe holder 30 is made of a synthetic resin having a self-lubricating property, such as Juracon®. A receiving recess 31 is formed in a front face of the probe holder 30 facing the connector guide 10. The receiving recess 31 is shaped so the front end portion of the connector 60 snugly fits into the receiving recess 31. A tapered surface 32 is formed on an edge of the opening of the receiving recess 31.

A plurality of probes 40 are provided within the receiving recess 31 and are aligned with the metal terminals 63 of the connector 60 when the connector 60 is placed in the connector guide 10. When the probe holder 30 is moved into the examination position, as shown FIG. 5, with the connector 60 disposed at the utmost retracted position and abutting against the metal terminal pushing member 20, the front end of each probe 40 slightly enters an associated cavity 62 through an entrance port 66. Each probes 40 contacts an associated metal terminal 63 in the proper inserted position.

Figure 7:
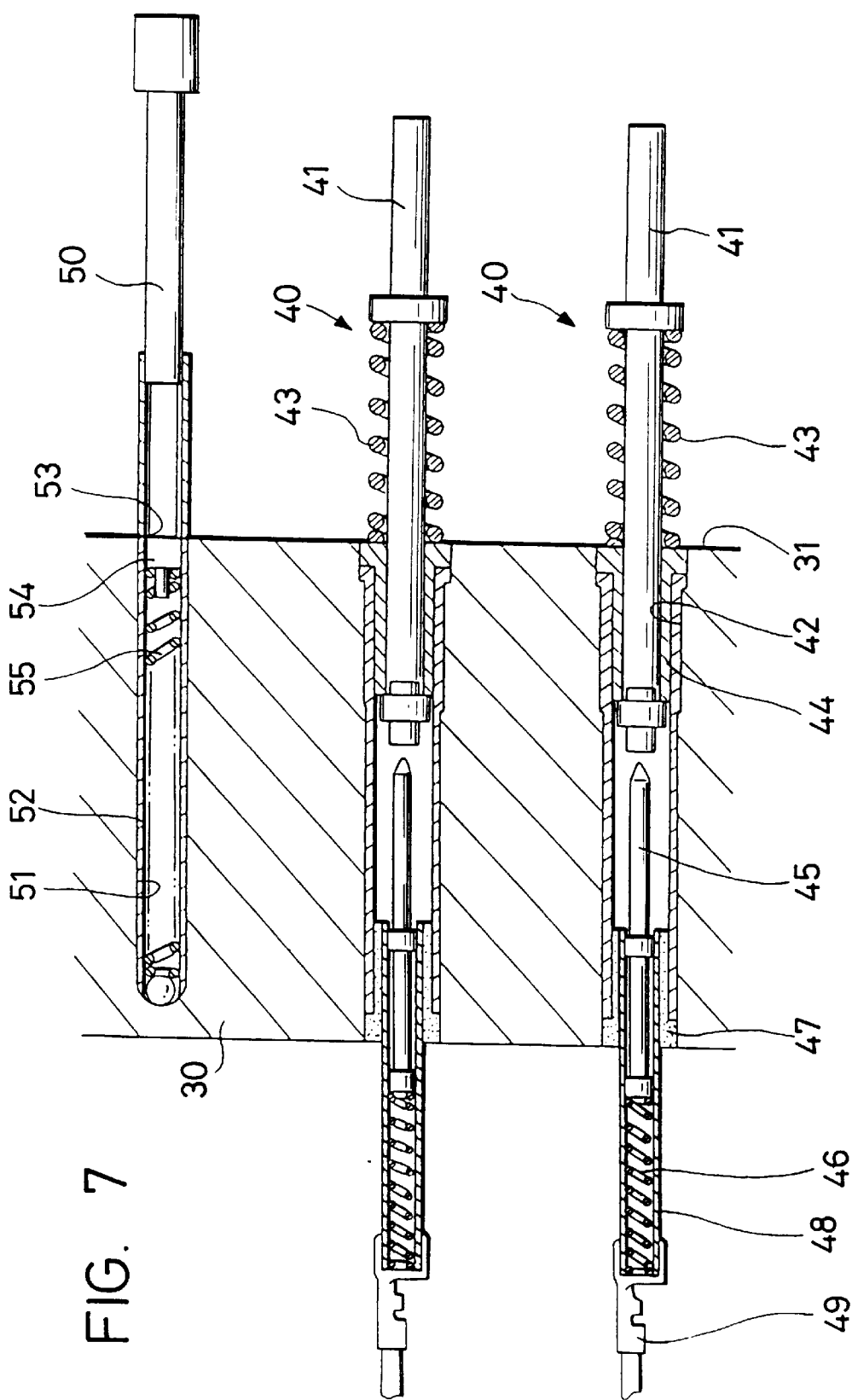
FIG. 7 is an enlarged cross sectional view of the first embodiment showing the construction of the probe and the construction of the connector pushing member.

As shown in FIG. 7, the probe 40 has an electrically conductive probe body 41 which projects into the receiving recess 31, with its rear end portion movably fitted in a probe fitting hole or bore 42 in the probe holder 30. The probe body 41 is urged in a projecting direction by a compression coil spring 43. The probe body is normally held in a predetermined projection position by a retaining member 44 mounted within the fitting hole 42. An electrically conductive pin 45 is movably mounted in the fitting hole 42 and is disposed rearwardly of the probe body 41. The conductive pin 45 is normally held in a stand-by position, by a compression coil spring 46, where it is slightly spaced apart from the probe body 41. When the probe body 41 is pushed back into the hole 42, the conductive pin 45 electrically connects with the probe body 41. When the probe body 41 is biased by spring 43 to the predetermined projection position and the conductive pin 45 is held in the stand-by position, the probe body 41 is electrically isolated from the conductive pin 45 through a non-conductive tubing 47. A metal terminal 49 is connected to the conductive pin 45 via an electrically conductive tube 48, which extends rearwardly from the fitting hole 42.

The probe 40 is connected via the metal terminal 49 to a conduction examination circuit (not shown) for a wire harness. The wires 64, which are assembled together as the wire harness, are attached to the connector 60. The wires 64 are correctable to the conduction examination circuit. The conduction examination circuit, electrically determines whether or not an electrical connection exists between each metal terminal 63 and the associated probe 40. The conduction examination circuit uses an indication means (not shown), such as a lamp, to indicate an electrical connection. Based on this indication, the conduction examination device 5 determines whether or not the metal terminal 63 is properly inserted in the associated cavity 62 in the connector 60.

A pair of elongate connector pushing members 50 are provided in the receiving recess 31 and are positioned opposite to an upper and a lower end portion of the connector 60 when the connector 60 is placed in the connector guide 10. As illustrated in FIG. 7, the connector pushing member 50 projects into the receiving recess 31. A rear end portion of the pushing member 50 fits into a guide tube 52 mounted in a fitting bore or hole 51 in the probe holder 30. The pushing member 50 is urged in a projecting direction by a resilient member 55, here shown as a compression coil spring positioned within the guide tube 52. The pushing member 50 is normally held in a projection position, such that a retaining portion 54 at a rear end of the pushing member is engaged with a stopper 53, which is formed by constricting a portion of the guide tube 52. When the probe holder 30 moves toward the connector 60 positioned in the holder portion 11, the distal ends of the connector pushing members 50 abut against the connector housing's 61 front end face before the distal ends of the probes 40 contact the respective metal terminals 63 in the proper inserted position.

In operation, the connector 60, having the metal terminals 63 attached and in the form of a wire harness, is fit into the holder portion 11 from the upper side of the connector guide 10. The connector 60 is brought into contact with the bottom surface 11a. The connector 60 does not need to be located so the pushing portions or of the metal terminal pushing member 20 are positioned within the insertion port 67 in the rear end of the connector 60. The connector 60 need only to be located in a position forward of the metal terminal pushing member 21, as shown in FIG. 2. The wires 64, extending from the connector 60, extend rearwardly of the connector guide 10 through a space between the two pushing portions 21.

The cam handle 4 is pivoted to move the probe holder 30 toward the connector guide 10. When the connector housing 61 is slightly inserted into the receiving recess 31, the connector pushing members 50 abut against the front end face of the connector housing 61, as shown in FIG. 3. The pushing members 50 push the connector 60, and, at the same time slightly compress the resilient members 55. The probes 40 are not in contact with the respective metal terminals 63 at this time. The connector 60 is then moved rearwardly along the holder portion bottom surface 11a only by the force applied by the connector pushing members 50.

The pushing portions 21 are then inserted into the insertion port 67 of the connector 60. When the connector 60 reaches its utmost retracted position, where it abuts against the metal terminal pushing member 20, the connector 60 is placed into the position shown in FIG. 4. During this time, if there are any improperly inserted metal terminals 63, the rear end of each improperly inserted metal terminal 63 abuts against one or more of the pushing portions 21. Each improperly inserted metal terminal 63 is forced by the pushing portion 21 into the connector 60. Thus, each improperly inserted metal terminal 63 reaches the proper inserted position simultaneously with the connector 60 reaching its utmost retracted position. Each formerly improperly inserted metal terminal 63 is retained against withdrawal by the lance (not shown) as are all of the other metal terminals 63.

Even after the connector 60 reaches its utmost retracted position and is stopped, the probe holder 30 continues to move. The probe holder stops when it reaches the predetermined examination position, as shown in FIG. 5. At this time, the resilient member 55 for each connector pushing member 50 has been further compressed. Each probe 40 is moved through a corresponding entrance port 66 in the connector 60 and brought into contact with the front end of the associated metal terminal 63. The probe body 41 is pushed back against the compression coil spring 43 by the associated metal terminal 63 to abut against the conductive pin 45.

In this position, since the connector 60 is urged rearwardly by the resilient members 55 of the connector pushing members 50, the connector 60 reaches its utmost retracted position where it abuts against the metal terminal pushing member 20. Therefore, a predetermined relation between the connector 60 and the metal terminal pushing member 20 is established. When any improperly inserted metal terminal 63 is moved by the metal terminal pushing member 20, this metal terminal 63 is positively brought into a final, proper insertion position.

If the lance within the cavity 62 engages the improperly inserted metal terminal in an abnormal manner, excessive resistance to the urging force from the connector pushing members 50 is produced. However, the resilient members 55 continue to be compressed into the guide tube 52 during the movement of the probe holder 30, so the connector 60 stops at a position short of the utmost retracted position. Therefore, the improperly inserted metal terminal 63 will not be pushed toward the proper insertion position and the lance and the metal terminal 63 will not be damaged due to pushing of the metal terminal 63.

During the movement of the probe holder 30, the connector pushing members 50 abut against the connector 60 to move the connector pushing members before each probe 40 contacts the associated metal terminal 63. The probes 40 will not abut against the metal terminals 63 and will not move the connector 60. Therefore, the components of the probe 40 will not be damaged.

Since the connector 60 reaches its utmost retracted position by the force applied by the resilient members 55, the probe holder 30, in the examination position, is in a constant, predetermined position relative to the connector 60. Thus, the probes 40 are also in a constant predetermined position relative to the metal terminals 63. Therefore, the contact pressure of the probe 40 against the metal terminal 63 is constant and the probe 40 will not be subjected to an excessive pressing force. Therefore, damage to the components of the probe 40 due to excessive contact pressure is prevented.

When the probe holder 30 is in the examination position, an electrical connection to the conduction examination circuit is made. It can then be determined whether or not an electrical connection between each metal terminal 63 and the associated probe 40 is made and its result is indicated. Based on the indicated results, it is checked whether or not each metal terminal 63 is properly inserted into the connector 60, and if there is any metal terminal 63 which is not properly inserted, the insertion is done again.

Thus, any improperly inserted metal terminal 63 is placed into the proper insertion position by the connector examination device 5. In contrast, in the known prior devices and checking methods, improper insertion is detected by a retainer which remains attached to a connector. The cost of the connector system using this first preferred embodiment is reduced by reducing the number of the component parts. Further, a re-examination after correcting the position of the metal terminal is unnecessary. Thus, this first preferred embodiment of the invention also advantageously achieves a highly efficient operation.

When the position of the improperly inserted metal terminal 63 is to be corrected, the connector pushing members 50 push the connector 60 via the resilient members 55. The connector 60 and the metal terminal pushing member 20 are placed into a constant, predetermined relationship, so the metal terminal 63 can be positively moved into the proper insertion position. At the same time, those portions of the metal terminal 63 engaged with the connector 60 will not be damaged by undue pushing due to the resilient members 55 exerting the movement force.

Furthermore, the wire harness conduction can be examined using probes 40 in this first preferred embodiment simultaneously with examinating the insertion of the metal terminals 63. Therefore, operational efficiency of the connector examination device 5 is enhanced. When examining the conduction, the probes 40 do not move the connector 60 and are not subjected to undue forces. Thus, the probes 40 are not be damaged. Since the positional relationship between the connector 60 and the probe holder is constant, the contact pressure between each probe 40 and the associated metal terminal 63 is advantageously held constant.

This invention is not limited to this first preferred embodiment. For example, the following additional embodiments fall within the scope of this invention.

In the first preferred embodiment, although the metal terminal pushing member 20 is fixed while the probe holder 30 is movable, in another embodiment, both the metal terminal pushing member and the probe holder are movable, or the metal terminal pushing member is movable and the probe holder is fixed.

In the first preferred embodiment, the conduction examination for the wire harness is simultaneous with examining the insertion of the metal terminals. In another embodiment of this invention, a probe is not provided in the connector and only the insertion examination for the metal terminals is carried out.

In a first embodiment of such an insertion examination device, two holder members are provided and a connector pushing member 50 is mounted, via a resilient member, on one of the holder members. A metal terminal pushing member 20 is mounted on the other holder member through a resilient member. A connector 60 is movably positioned between the connector pushing member 50 and the metal terminal pushing member 20. In this embodiment, both of the holder members may be movable, or one of them may be movable while the other is fixed.

In a second embodiment of the insertion examination device, two holder members are provided and a connector pushing member 50 is mounted, via a resilient member, on one of the holder members. A metal terminal pushing member 20 is integrally mounted on the other holder member. A connector 60 is movably positioned between the connector pushing member 50 and the metal terminal pushing member 20. In this embodiment, both of the holder members may be movable, or one of them may be movable while the other is fixed.

In a third embodiment of the insertion examination device, two holder members are provided and a connector pushing member 50 is integrally mounted on one of the holder members. A metal terminal pushing member 20 is mounted, via a resilient member, on the other metal holder member. A connector 60 is movably positioned between the connector pushing member 50 and the metal terminal pushing member 20. In this embodiment, both of the holder members may be movable, or one of them may be movable while the other is fixed.

In a fourth preferred embodiment of the insertion examination device, the third preferred embodiment is modified such that a connector 60 is immovably held on one of holder members. A metal terminal pushing member 20 is mounted by a resilient member on the other holder member. The two holder members are movable relative to each other. In this case, there is no need for providing the connector pushing member.

The insertion examination devices in these preferred embodiments are similar to the first preferred embodiment of the connection examination device with respect to the connector pushing member 50 and the metal terminal pushing member 20 being movable relative to each other. The force of the resilient member is utilized to correct the position of the metal terminal 63. Therefore, when the position of the metal terminal 63 needs to be corrected, the insertion examination device achieves the same results as achieved by the first preferred embodiment of the connection examination device.

In the first preferred embodiment of the connection examination device, although each pushing portion 21 of the metal terminal pushing member 20 has a plate-like configuration and abuts against a plurality of the metal terminals 63 at the same time, the metal terminal pushing member 20 may take many different forms, such as a comb-like construction where a plurality of separate pushing portions 21 contact the metal terminals 63.

In the first preferred embodiment of the connection examination device, although the resilient members comprise a compression coil spring, any other type of resilient member may be used, such as a tension coil spring and a leaf spring. The material of the resilient members may be metal, plastic, rubber or the like.

Embodiment 2

Figure 8:
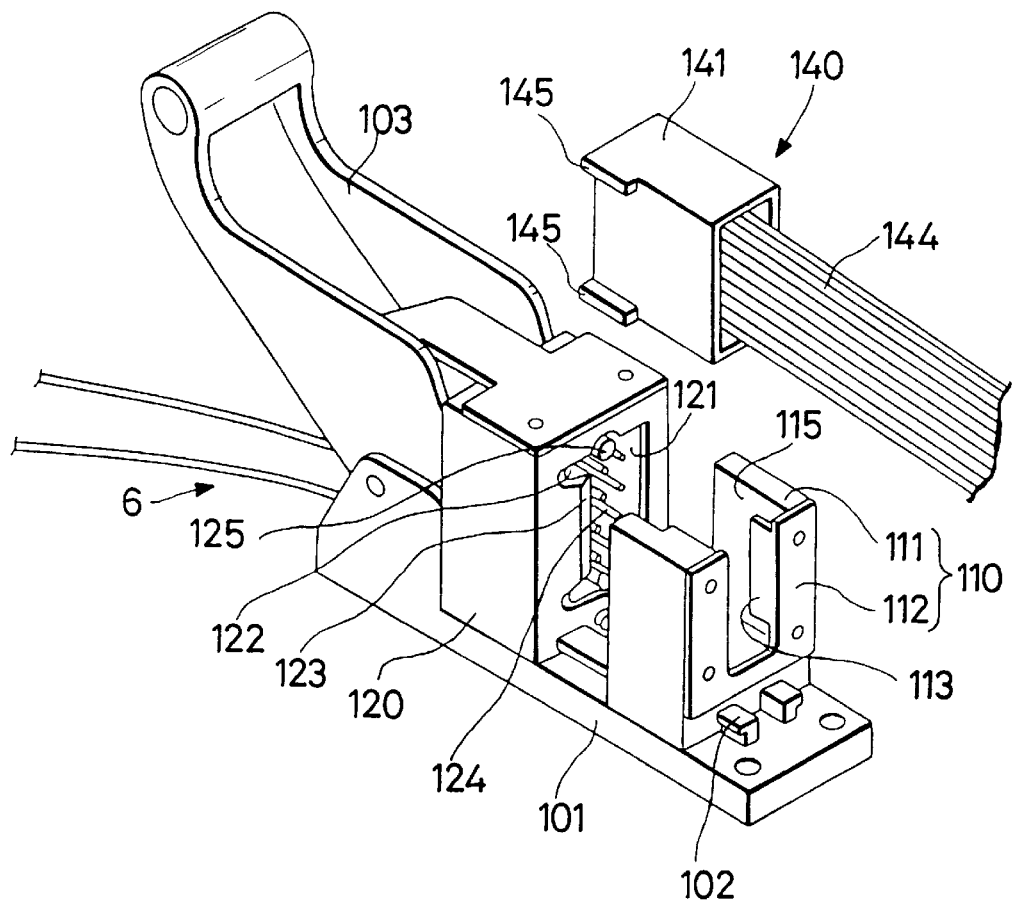
FIG. 8 is a perspective view of a second embodiment of the invention.

FIGS. 8–14b show a second preferred embodiment of the connection examination device 6. As shown in FIG. 8, a second preferred connector examination device 6 comprises one or more rails 102 and a cam handle 103, which are mounted, on a base plate 101. A connector holder 110 is fixedly mounted on the base plate 101. A metal terminal pushing member 113 is mounted integrally with the connector holder 110. A probe holder 120 is movable toward and away from the connector holder 110 by pivotably moving the cam handle 103, and is guided by the rails 102. One or more probes 124 are mounted on the probe holder 120, as are one or more connector pushing members 125.

A connector 140, holdable by the connector holder 110, comprises a connector housing 141 formed of a synthetic resin material. One or more metal female terminals 143 are inserted in a plurality of cavities 142 provided in the connector housing 141. Each cavity 142 is open to a front end face and a rear end face of the connector housing 141.

The insertion ports 146, through which one or more metal male terminals of a mating connector (not shown) and the probes 124 are inserted into the cavities 142, are formed in the front end face of the connector housing 141 and open to the cavities 142.

The cavities 142 in the connector housing 141 are arranged in two horizontal rows. Each row of cavities 142 extends in a vertical direction. A metal terminal 143 is inserted into an associated cavity 142 through the insertion port 146 provided at the rear side. A wire 144, which is fixedly secured to the metal terminal 143, extends rearwardly of the connector housing 141. When the metal terminal 143 is inserted into a proper position in the cavity 142, a lance (not shown) provided in the cavity 142 engages a retaining portion (not shown) formed on the metal terminal to retain the metal terminal 143 against being withdrawn from the connector 140.

If the metal terminal 143 is inserted to an improper inserted position short of the proper position, the lance is unable to prevent the metal terminal 143 from being withdrawn. Therefore, the metal terminal 143 may be withdrawn from the cavity 142. In this situation, the position of the metal terminal 143 is moved into the proper inserted position by the connection examination device 6.

The connector holder 110 holds the connector 140. The connector holder 110 comprises a holder body 111 made of a synthetic resin material having a self-lubricating property, such as "Juracon®". The connector holder 110 has a U-shaped metal terminal correcting jig 112 fixedly secured to a rear end surface of the holder body 111. The holder body 111 has a U-shaped cross-section to define an open space with its front, rear and top surfaces.

The space in the holder body 111, which is open to the front, rear and top surfaces, is a holder portion 115. The distance between parallel opposite side walls forming the holder portion 115 is generally equal to the width of the connector 140. The connector 140, when placed in the holder portion 115, is unable to be moved or tilted laterally, but is movable and tiltable in other directions, such as in an upward-downward direction. When properly held, the connector 140 has a lower surface which contacts a bottom surface of the holder portion 115, and a peripheral edge portion of its rear end surface which contacts the metal terminal correcting jig 112. In this position, the insertion ports 146 in the front surface of the connector 140 are aligned with the probes 124.

The metal terminal correcting jig 112 also has a U-shape. The metal terminal correcting jig 112 is fixedly secured to a rear end surface of the connector holder 110. The metal terminal correcting jig 112 has a pair of lateral plate-like pushing portions 113 which project into the connector holder 110 beyond the edges of side walls of the connector holder 110. The pushing portions 113 enter the end portion of the connector 140 when the connector 140 is placed in the holder portion 115. When the connector 140 is placed in its utmost retracted position with its rear end abutting against the metal terminal pushing member 113, the front ends of the pushing portions 113 abutting against the rear ends of the metal terminals 143 disposed in the proper inserted position. Therefore, for any metal terminal 143 which is inserted into an improper position, the pushing portion 113 abuts against this improperly inserted metal terminal 143 so the connector 140 is disposed forwardly of the utmost retracted position, and is spaced apart from the metal terminal pushing member 113. When the connector 140 is moved rearwardly, with the improperly-inserted metal terminal 143 abutting against the pushing portion 113, the improperly-inserted metal terminal 143 is pushed by the pushing portion 113 relative to the connector 140. Simultaneously, when the connector 140 reaches the utmost retracted position, this metal terminal 143 is placed into the proper insertion position.

Figure 9:
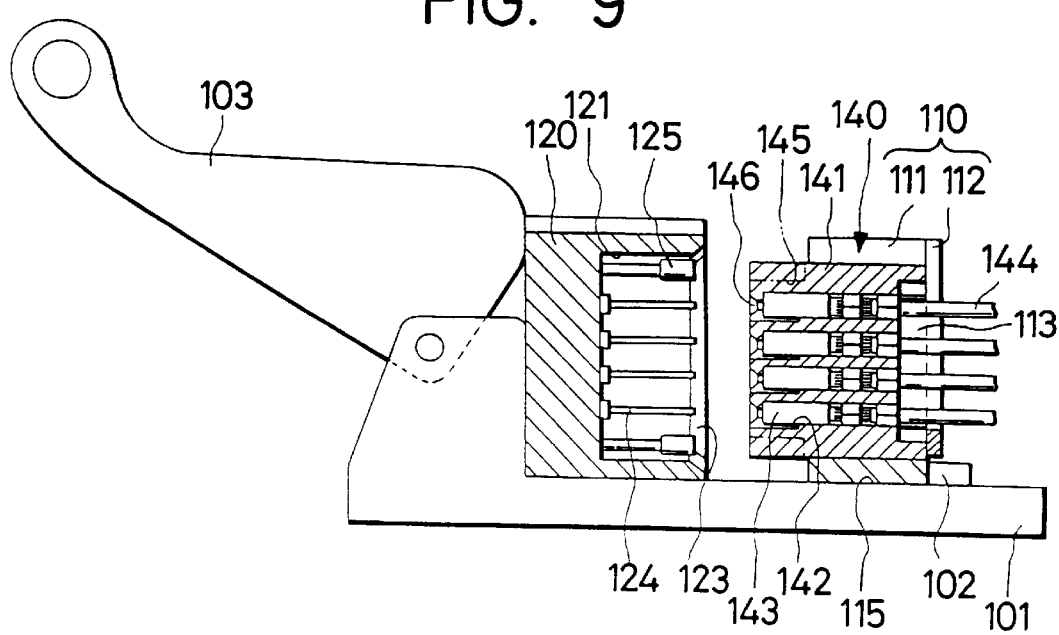
FIG. 9 is a cross-sectional view of the second embodiment showing a position not ready for a conduction examination.
Figure 10:
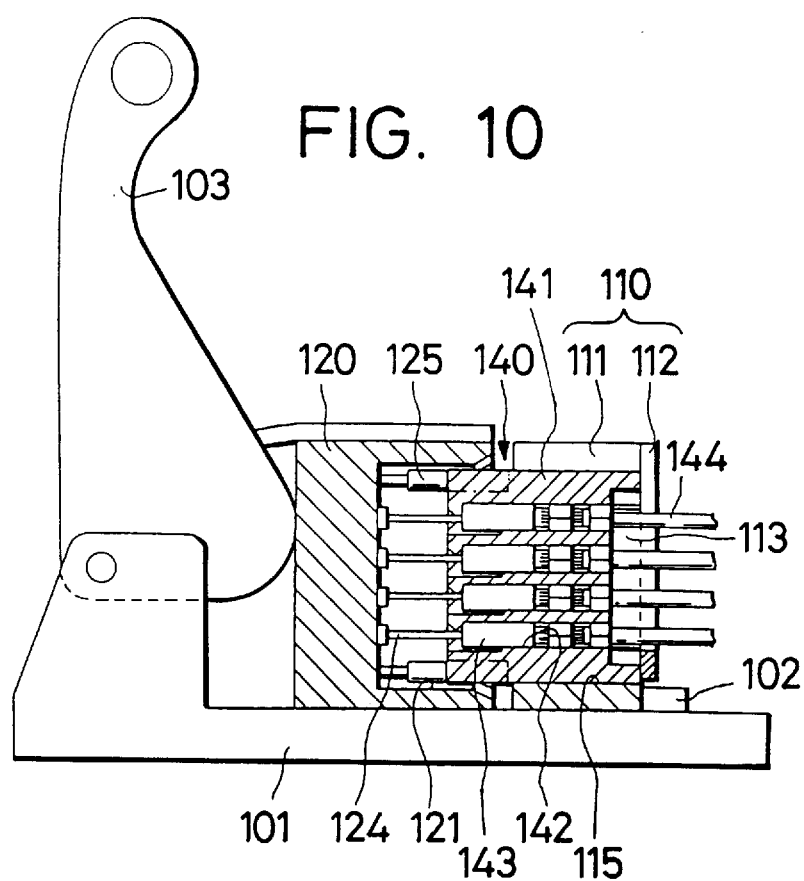
FIG. 10 is a cross-sectional view of the second embodiment showing a position for the conduction examination.
Figure 11:
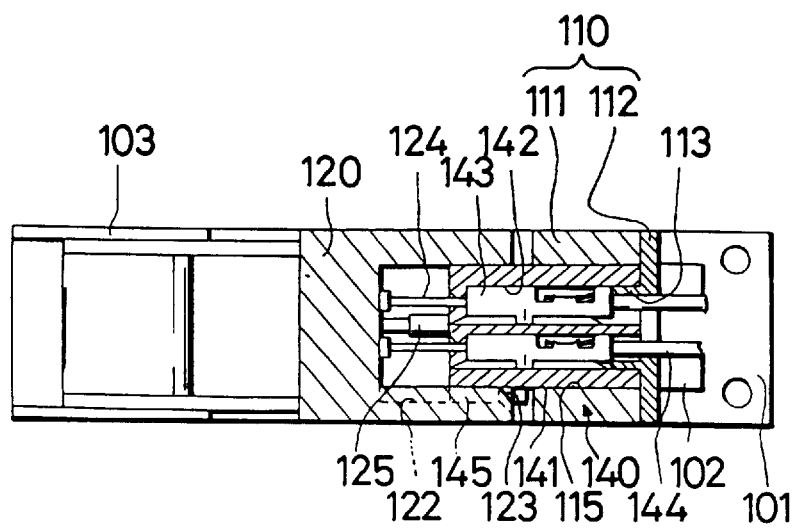
FIG. 11 is a cross sectional top view of the second embodiment showing a position in which the conduction examination is effected.

By pivotably moving the cam handle 103, the probe holder 120 is movable between a stand-by position, as shown in FIG. 9, where the probe holder 120 is separated from the connector holder 110, and an examination position, as shown in FIG. 10, where the probe holder 120 is positioned a predetermined distance from the connector holder 110. The probe holder 120 is also made of a synthetic resin having a self-lubricating property, such as Juracon®. A receiving recess 121 is formed in a front face of the probe holder 120 facing the connector holder 110. The receiving recess 121 is shaped so the front end portion of the connector 140 snugly fits in the receiving recess 121. The receiving recess 121 is generally rectangularly shaped, to snugly receive the connector 140. A plurality of recesses or grooves 122 are formed in two corners of this rectangular configuration on one side and connected to upper and lower sides. A plurality of correction abutment portions 145 on the connector 140 fit in the grooves 122. An outwardly flaring tapered surface 123 is formed over an entire periphery, including the grooves 122, of an edge of the open end of the receiving recess 121. When the connector 140 is in a tilted condition, as shown in FIG. 12, the correction abutment portion 145 abut against the tapered surface 123.

A plurality of probes 124 positioned opposite to the insertion ports 146 of the connector 140 are provided within the receiving recess 121. When the probe holder 120 is moved to an examination position, the front end of each probe 124 slightly enters the associated cavity 142 through the insertion port 146 and contacts a properly positioned associated metal terminal 143. The probe 124 is connected via the metal terminal 143 to a conduction examination circuit (not shown) for a wire harness. The wires 144, which are assembled together as the wire harness, are attached to the connector 140. The wires 144 are connectable to the conduction examination circuit. The conduction examination circuit determines whether or not an electrical connection exists between each metal terminal 143 and the associated probe 124. The conduction examination circuit uses an indication means (not shown), such as a lamp, to indicate the state of the electrical connection. Based on this indication, the conduction examination device 6 indicates whether or not the metal terminal 143 is properly inserted in the associated cavity 142 in the connector 140.

A pair of elongate connector pushing members 125 are provided in the receiving recess 121 and are positioned opposite to the upper and lower end portions of the connector 140 when the connector 140 is placed in the connector holder 140. When the probe holder 120 is moved toward the connector 140 positioned in the holder 110, the distal ends of the connector pushing members 125 abut against the connector housing front end face before the distal ends of the probes 124 contact with the metal terminals 143 in the proper inserted position.

In operation, the connector 140, having the metal terminals 143 constituting the wire harness, is placed into the holder portion 115 from the upper side of the connector holder 110. The wires 144 pass through the space between the two metal terminal pushing portions 113 of the metal terminal correcting jig 112 and extend rearwardly from the connector holder 110. With the connector 140 in this position, the cam handle 103 is pivoted to move the probe holder 120 toward the connector holder 110.

If the connector 140 is not tilted and its lower surface is held in contact with the bottom surface of the holder portion 115, the correction abutment portions 145 of the connector 140 are in register with the grooves 122. The front face of the connector housing 141 is entirely inserted in the receiving space 121, so the connector pushing portions 125 abut against the front face. The connector pushing portions 125 then move the connector 140 rearwardly along the bottom surface of the holder portion 115 while compressing the springs.

At this point, if there are any half-inserted metal terminals 143 in the connector 140, each such metal terminal 143 is moved by the metal terminal pushing portion 113 relative to the connector 140 and inserted deeper into its proper position as the connector 140 moves.

After the rear end surface of the connector 140 abuts against the metal terminal correcting jig 112 and is held in this position, the probe holder 120 moves to the examination position. The probes 124 contact the metal terminals 143 and the conduction examination of the wire harness is carried out.

Figure 12A:
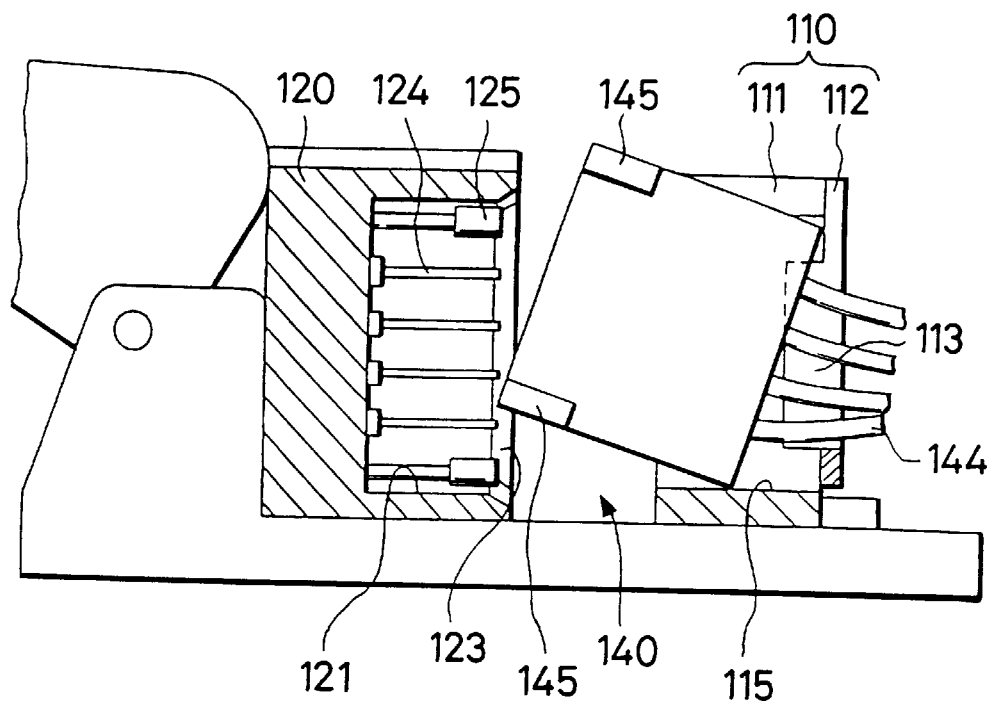
FIGS. 12(*a*) and 12(*b*) are cross-sectional views of the second embodiment showing a position where a connector is held in a tilted orientation.

Next, when the connector 140 is fit in the holder portion 115 in an upwardly tilted position, as shown in FIG. 12(a), is explained. If the tilted connector 140 interferes with the probe holder 120, the probes 124 abut the connector 140 such that the probes may be damaged. However, in this second preferred embodiment of the connection examination device 6, when the probe holder 120 approaches the connector holder 110, the lower correction abutment portion 145 abuts against the tapered surface 123 at the straight portion between the upper and lower grooves 122, as shown in FIG. 12(a). This abutment is due to the widthwise dimension of the connector 140 where the correction abutment portions 145 are wider than those portions of the receiving recess 121 where the grooves 122 are not provided. As the probe holder 120 approaches the connector holder, the correction abutment portion 145 contacts and directed by the tapered surface 123. The connector 140 encounters a force angularly moving the connector 140 counterclockwise (in FIG. 12) about a contact point between the rear end upper edge of the connector 140, which is above the correction abutment portion 145, and the metal terminal correcting jig 112. By this angular moving force, the orientation of the connector 140 is corrected.

In accordance with the change of the orientation of the connector 140, the correction abutment portion 145 is in sliding contact with the tapered surface 123. The upper edge of the rear end of the connector 140 slides in contact with the metal terminal correcting jig 112 surface. The rear end lower edge of the connector 140 slides in contact with the bottom surface of the holder portion 115. Any sliding resistances produced during the contact are small since the connector holder 110 and the probe holder 120 are constructed from a synthetic resin having a self-lubricating property. Therefore, the sliding in the change of the orientation of the connector 140 is smoothly effected.

Figure 12B:
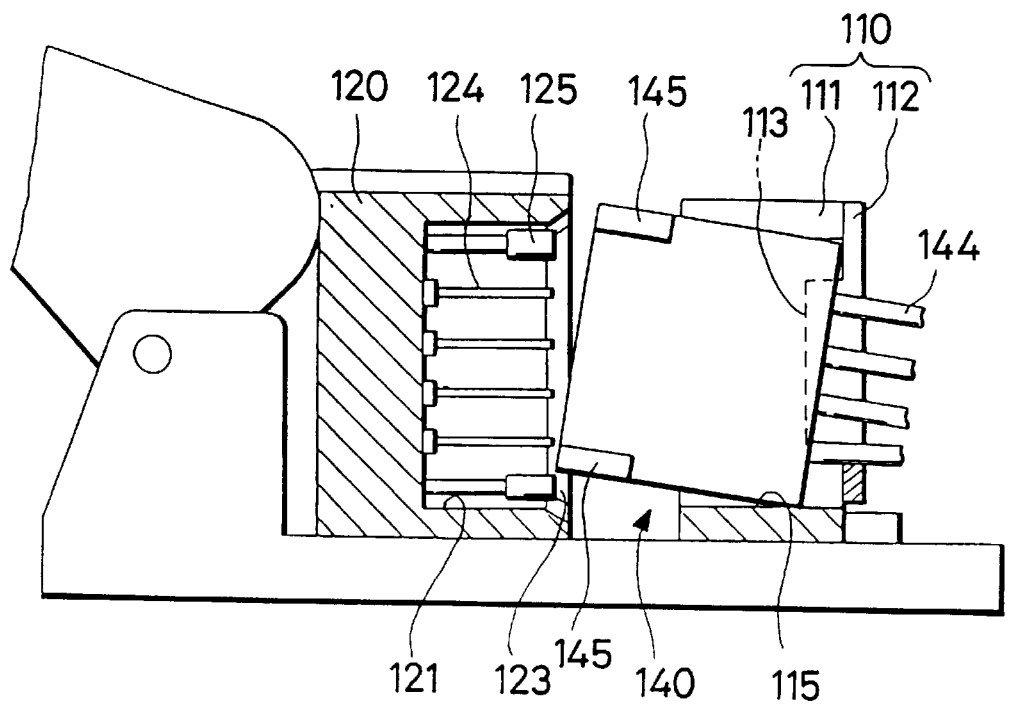
Figure 13:
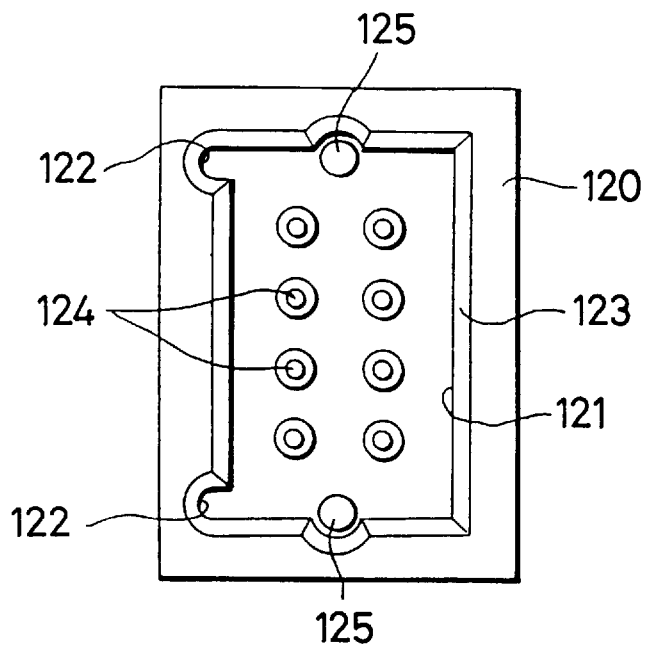
FIG. 13 is a front plan view of a probe holder of the second embodiment.
Figure 14A:
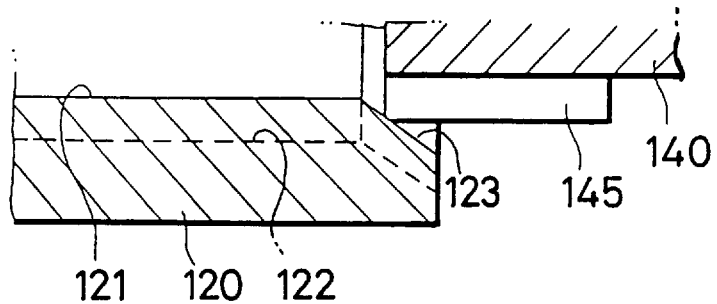
FIGS. 14(*a*) and 14(*b*) are cross-sectional views of the second embodiment showing a position where the tilted connector is abutted against the probe holder.
Figure 14B:
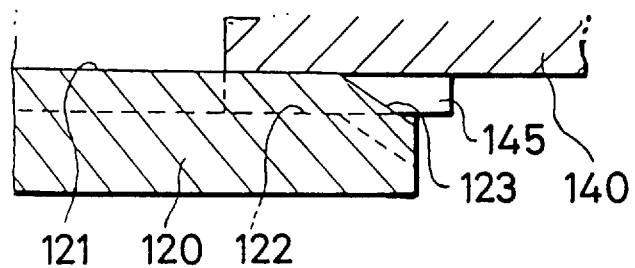

The connector 140, with a proper orientation, is brought into the position shown in FIG. 12(b) and then into the properly held position where its lower surface is in contact with the bottom surface of the holder portion 115. Its rear end surface is held in contact with the metal terminal correcting jig 112. At the same time, the connector 140 is inserted into the receiving recess 121 so the probes 124 are positioned opposite to the metal terminals 143. In this position, the connector 140 fits into the receiving recess 121 as shown in FIG. 14(b) as the probe holder 120 moves further toward the examination position. The probes 124 contact the metal terminals 143, so the conduction examination can be carried out.

If there is a degree of play between the connector 140 and the connector holder 110, so the connector 140 is laterally displaceable, the position of the connector 140 is corrected by the tapered surface 123. Therefore, the connector 140 is properly inserted into the receiving recess 121, and the connector 140 positively fits in the receiving recess 121.

Even if there are any half-inserted metal terminals 143, each incorrectly-inserted metal terminal 143 is pushed by the metal terminal pushing portion 113 into the proper position before the connector 140 is brought into the proper position. If a force holding the metal terminal 143 in the incorrectly-inserted position is large, the rear end of this metal terminal abuts against the metal terminal pushing portion 113. Thus, the rear end upper edge of the connector 140 is spaced from the metal terminal correcting jig 112. However, the orientation of the connector 140 is corrected so the lower surface is brought into contact with the bottom surface of the holder portion 115. When the connector 140 is pushed by the connector pushing portions 125 into the position where the connector 140 abuts against the metal terminal correcting jig 112, metal terminals 143 are pushed by the metal terminal pushing portion 113 from the half-inserted position from the proper inserted position.

Although the above operation has been described when the connector 140 is tilted upwardly, if the connector 140 is tilted downwardly, the position can also be corrected into the proper position by a similar operation.

In the connector examination device 6 of the second preferred embodiment of this invention, even if the connector 140, when held by the connector holder 110, is tilted, the position of the connector 140 is automatically corrected. Therefore, the probes 124 do not abutment against the front end surface of the connector 140 and are prevented from being damaged, bent or broken. This avoids the probe 124 being unable to be inserted into the associated cavity 142, and prevents disenabling the conduction examination.

In this second preferred embodiment, due to the connector pushing portions 125 and the metal terminal pushing portions 113, any incorrectly-inserted metal terminals 143 are moved into the proper position as the connector holder 110 and the probe holder 120 approach each other. Therefore, in contrast to the inserted condition of the metal terminals 143 being detected separately from the conduction examination, it is not necessary to re-insert an incorrectly-inserted metal terminal 143 from the start of the operation. Since the correction of the position of the metal terminals 143 and the conduction examination are carried out simultaneously, the operational efficiency is quite high.

Since the connector pushing portions 125 are provided on the probe holder 120 by springs, the connector 140 can be pressed against the metal terminal correcting jig 112 under the influence of these springs and held in the proper condition. Therefore, at the time of the conduction examination, the positional relationship between the connector 140 and the probes 124 is constant. The pressure of contact of the probe 124 against the associated metal terminal 143 is also constant. Therefore, the probe 124 is prevented from being damaged, bent or broken due to undue pressure.

When the position of an incorrectly-inserted metal terminal 143 needs to be corrected, the positional relationship between the connector 140 and the metal terminal pushing portion 113 is constant. Therefore, the incorrectly-inserted metal terminal 143 is positively moved into the proper position.

Moreover, if an incorrectly-inserted metal terminal 143 is caught in the cavity 142 with an undue force, such that the incorrectly-inserted metal terminal 143 can not be moved into the proper position, the springs are resiliently deformed to stop the movement of the connector 140. This prevents the metal terminal 143 from being forcibly moved toward the proper position. Thus, the metal terminal 143 caught in the cavity 142 will not be damaged since the metal terminal 143 is not forcibly moved.

Furthermore, in this second preferred embodiment of the connection examination device 6, the tapered surface 123 is formed on the edge of the open end of the receiving recess 121. The correction abutment portion 145 of the connector 140 can be brought into point contact with this tapered surface. Therefore, compared with a linear contact and a surface contact, the sliding resistance between the probe holder 120 and the connector 140 is smaller and the connector 140 can be smoothly corrected in position without being caught.

The above invention is not limited to this second preferred embodiment, and for example, the following additional embodiments fall within the scope of the present invention.

In the second preferred embodiment of the connection examination device 6, the connector holder 110 is alternately open laterally to either side. In this situation, the connector 140 is tilted in the lateral direction and the correction abutment portions are formed on opposite lateral edges of the upper or the lower surface of the connector 140.

In the second preferred embodiment of the connection examination device 6, although the tapered surface 123 is formed on the edge of the open end of the receiving recess 121, the tapered surface may be omitted. In this case, the correction abutment portions 145, which projects from the side surfaces of the tilted connector, are not received into the receiving recess. Rather, the correction abutment portions abut against the front end surface of the probe holder and slide along the edge of the open end of the receiving recess to correct the position of the connector.

In the second preferred embodiment of the connection examination device 6, the front side of the connector 140, as well as the opening in the receiving recess, may have any other suitable shape, even though the front side of the connector 140 is described having a generally rectangular shape.

In the second preferred embodiment of the connection examination device 6, although the conduction examination of the wire harness and the position correction of the metal terminals 143 are effected simultaneously, due to the connector pushing portions 125 and the metal terminal-pushing portions 113, the conduction examination of the wire harness can be carried out separately from the detection of the inserted condition of the metal terminals, as well as the correction of the position of the metal terminals (if necessary). In this situation, it is not necessary to provide the connector pushing portions and the metal terminal pushing portions.

The second preferred embodiment of the connection examination device 6 is directed to examinating the conductivity of the wire harness whether or not there is an electrical connection between the metal terminals 143 and the probes 124, the invention is applicable to a device for determining whether or not each metal terminal has been inserted to its proper position. In this case, the connector pushing portions and the metal terminal pushing portions 113 are unnecessary and are not provided.

In the second preferred embodiment of the connection examination device 6, although the connector holder 110 is fixed while the probe holder 120 is movable, the probe holder 120 may be fixed while the connector holder 110 is movable. Alternatively, both the connector holder 110 and the probe holder 120 may be movable. In either case, the two holders are relatively movable to and away from each other. Therefore, the effects achieved by these alternate arrangement are the same as those of the second preferred embodiment.

Embodiment 3

Figure 15:
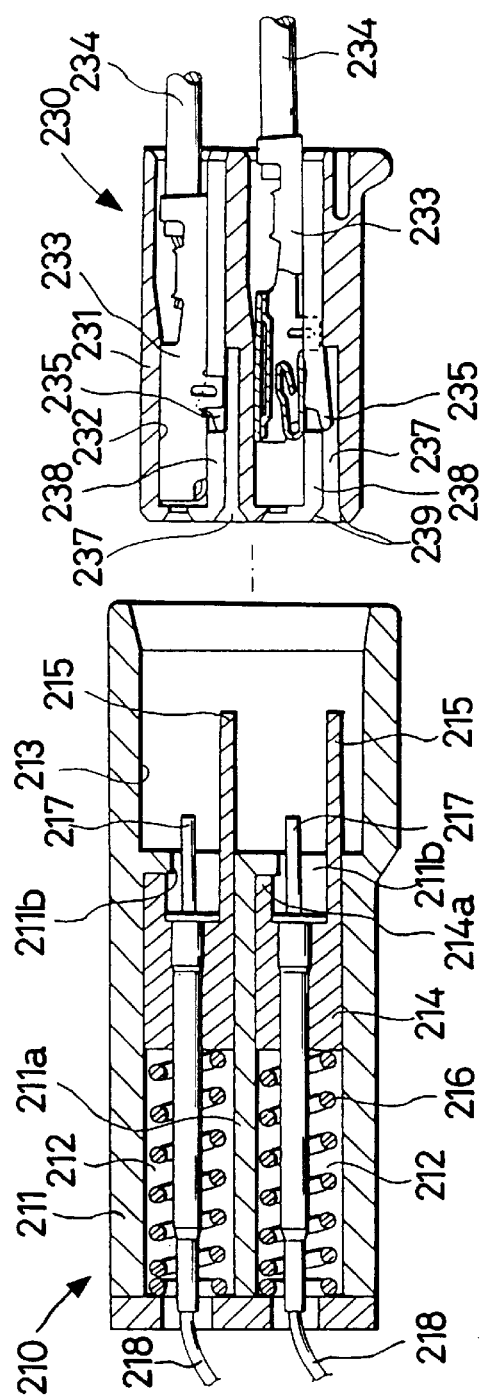
FIG. 15 is a cross-sectional view of a third embodiment of the invention showing a condition before an examination.

FIGS. 15–19 show a third preferred embodiment of the examination device 210. As shown in FIG. 15, the connector 230 is examined by the examination device 210. A connector housing 231 is molded into a rectangular shape from a synthetic resin and has a plurality of cavities 232 arranged in two stages. Each cavity 232 extends through the connector housing 231 in a front to rear direction. A metal terminal 233 is inserted into each cavity 232 from a rear side (right side), as shown in FIG. 15. Each metal terminal 233 is a metal female terminal of a well-known construction matable with a metal male terminal provided in a mating connector (not shown). A wire 234 is clamped to the metal terminal 233.

Figure 17:
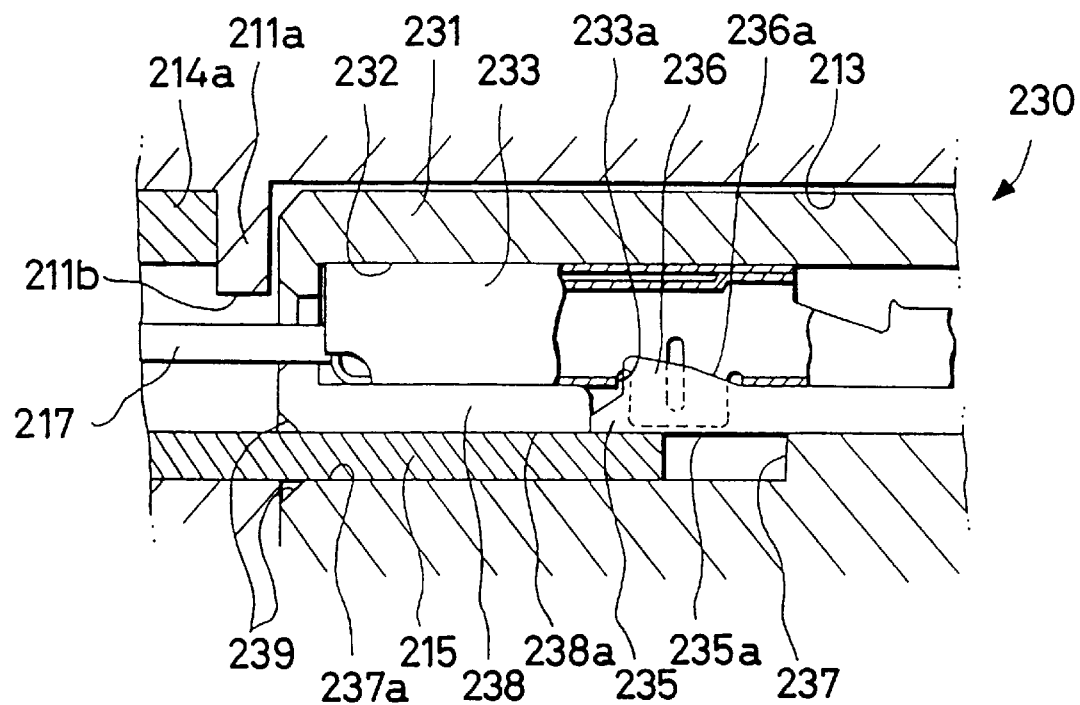
FIG. 17 is an enlarged, cross-sectional view of a portion of the connector examination device of the third embodiment during the examination.
Figure 18:
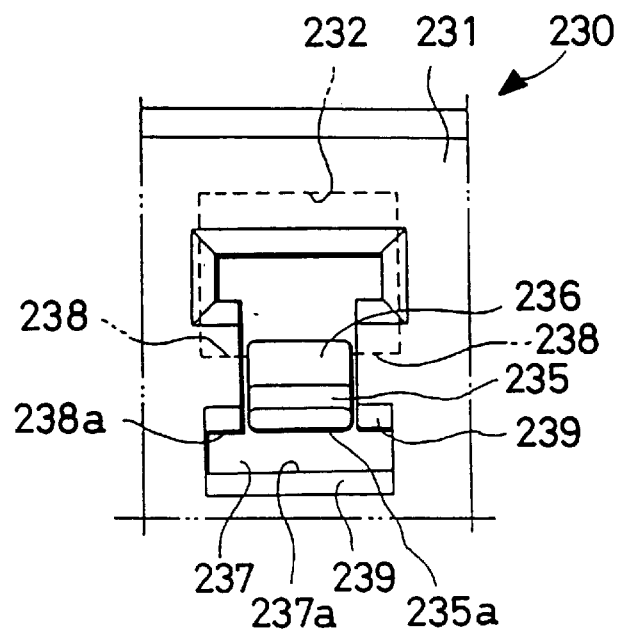
FIG. 18 is a front plan view of a connector of the third embodiment.
Figure 19:
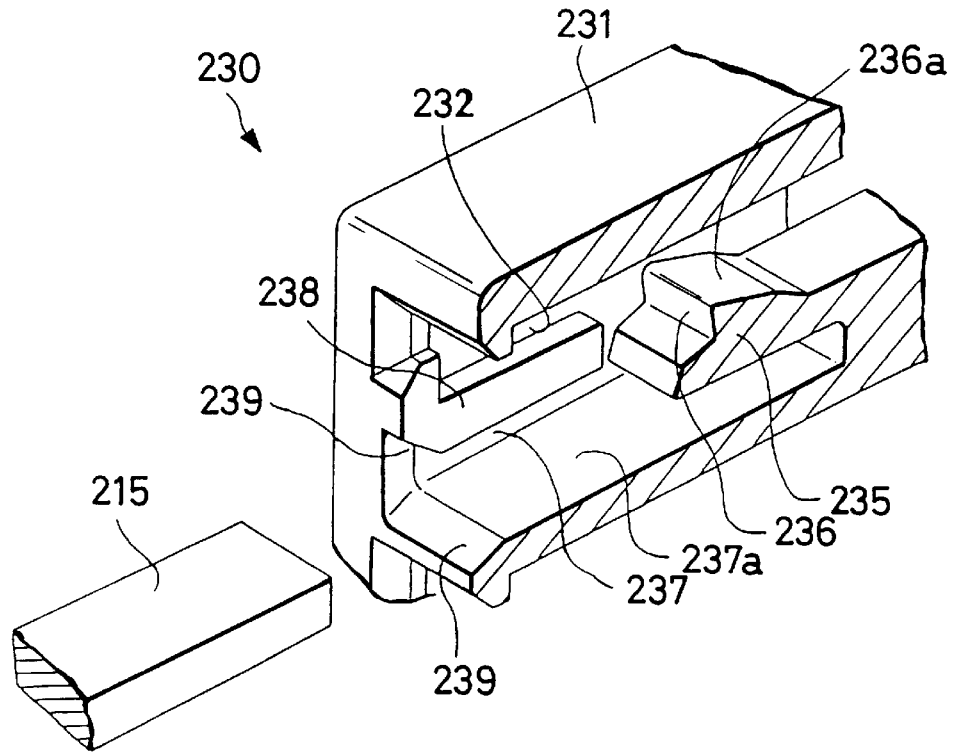
FIG. 19 is a perspective cross sectional view showing the connector and a lance check pin of the third embodiment.

The lances 235 which retain the associated metal terminal 233 against withdrawal are formed integrally with the connector housing 231. Each lance 235 is projected forwardly in a cantilevered fashion and elastically flexes away from the cavity 232 (downward in FIG. 15). A raised retaining portion 236, which engages with the metal terminal 233, is formed on and projects from the surface (upper side in FIG. 15) of the lance 235 facing the cavity 232. As shown in FIG. 17, when the lance 235 retains the metal terminal 233 in a proper inserted position against withdrawal, a lower surface 235a of the lance 235 is positioned parallel to a bottom surface 237a of a lance flexure space 237.

Each lance flexure space 237 allows for a downward elastic deformation of the lance 235. Each space 237 is formed within the connector housing 231 utilizing mold removal spaces. The lance flexure space 237 is open to the front end surface of the connector housing 231 and is in communication with the lower side of the cavity 232.

Figure 16:
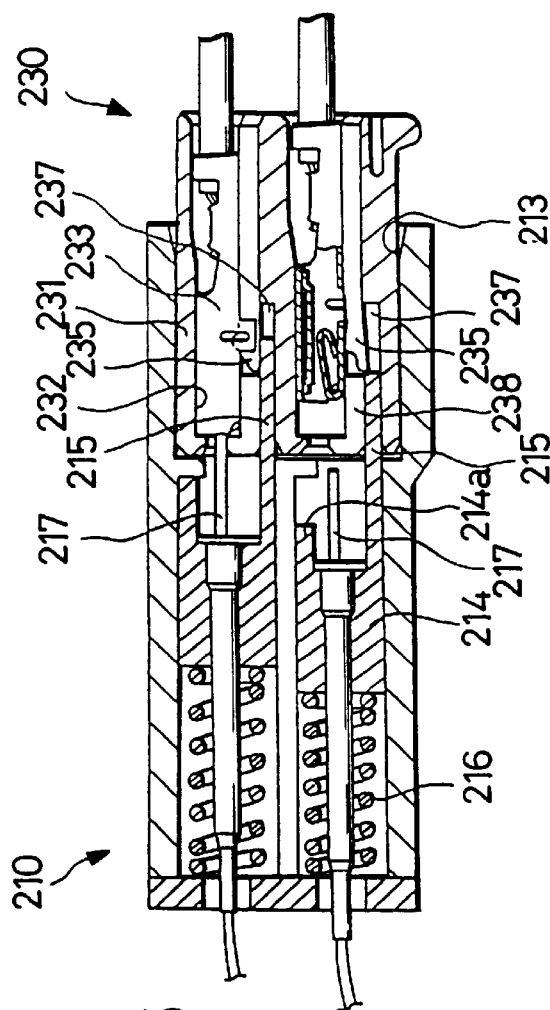
FIG. 16 is a cross-sectional view showing a condition during the examination effected by a connector examination device of the third embodiment.

As shown in FIGS. 15–17, pair of metal terminal support portions 238 and 238 are provided between the lance flexure space 237 and the cavity 232. These support portions 238 extend over an area from the front surface of the connector housing 231 to a position near to the front end of the lance 235 and project from opposite side wall surfaces of the space 237. The upper surfaces of the metal terminal support portions 238 form part of the bottom surface of the cavity 232. The lower surfaces 238a of the metal terminal support portions 238 form part of the upper surface of the lance flexure space 237 and are positioned parallel to the bottom surface 237a of the lance flexure space 237.

The height or level of the lower surface 238a of the metal terminal support portion 238 is the same as the lower surface 235a, including that portion facing the lance flexure space 237, of the lance 235 when in condition to retain a properly inserted metal terminal 233 against withdrawal. The two surfaces 235a and 238a are flush with each other in this condition.

When the metal terminal 233 is inserted into the cavity 232, the front end of the metal terminal 233 abuts against a slanting surface 236a of the retaining portion 236 of the lance 235. The lance 235 is pressed downward during this inserting operation so the lance 235 is elastically deformed into the lance flexure space 237, with its front end directed downwardly. When the metal terminal 233 is moved into an innermost end of the cavity 232 and reaches the proper insertion position, an engagement recess 233a in the metal terminal 233 registers with the retaining portion 236. The lance 235 then moves upwardly because of its elastic restoring force, causing the retaining portion 236 to fit in the engagement recess 233a. Thus, the metal terminal 233 is retained against withdrawal.

In FIG. 16, the upper metal terminal 233 is in the proper insertion position and retained by the lance 235. The lower metal terminal 233 is disposed in an improper insertion position which is short of the proper position. Thus, the lance 235 is deflected into the lance flexure space 237.

The third preferred embodiment of the examination device 210 has a connector housing 211. The interior of the connector housing 211 is divided by the partition walls 211a into a plurality of small chambers to define the cavity 212, which correspond to the cavities 232 in the connector housing 231. This connector housing 211 has a square shaped hood portion 213 for receiving the connector 230 to be examined. The hood portion 213 is positioned adjacent to the front ends of the cavities 212.

A slider 214, made of a synthetic resin having a self-lubricating property, such as Juracon®, is slidably positioned within each cavity 212. The slider 214 is normally urged to the right (in FIG. 15) by a weak compression spring 216 positioned in the cavity 212. When the connector 230 is not inserted into the hood portion 213, the slider 214 is held in a stand-by position, with its stopper 214a abutted against the partition wall 211a, as shown in FIG. 15.

A square-cross-section, elongated lance check pin 215 is integrally formed at the front end of the slider 214 and can be smoothly and snugly inserted into a lance flexure space 237. The lance check pin 215 extends into the hood portion 213 through a through hole 211b in the partition wall 211a. When the connector 230 is inserted into the hood portion 213, the lance check pin is positioned opposite to an open end of the associated lance flexure space 237.

An electric contact member 217, comprising an electrically conductive metal bar, is fixedly secured, for example, by being press fit, to the slider 214 and moved with the slider 214. The electric contact member 217 extends parallel to the lance check pin 215 and projects short of the lance check pin 215. The front end position of the electric contact member 217 permits the front end to contact the front end of the associated metal terminal 233 when the lance check pin 215 is inserted a predetermined depth into the associated lance flexure space 237.

The electric contact members 217 are connected to a conduction examination circuit (not shown) through respective lead wires 218. This conduction examination circuit determines whether or not the metal terminals 233 are properly inserted in the cavities 232 of the connector 230. The circuit may be assembled as a wire harness. This circuit is of conventional construction and includes a power source. The circuit determines whether or not electric current flows between the metal terminals of two connectors provided at opposite ends of the wire harness.

In operation, the metal terminals 233 which are clamped to the wires 234, are inserted into the cavities 232 in the connector housing 230. A number of wires 234 may be combined together into a bundle by a tape or the like to form a wire harness. The wire harness to be examined is placed on an examination plate and the connector 230 is set in the hood portion 213 of the connector examination device 210 as shown in FIG. 16.

When the connector 230 is inserted into the hood portion 213, each lance check pin 215 is inserted into the associated lance flexure space 237. At this time, even if the front end of the lance check pin 215 is displaced upwardly, downwardly, right or left, with respect to the open end of the lance flexure space 237, the front end of the lance check pin 215 abuts against a tapered surface 239 and slides over this slanting surface. The position of the lance check pin 15 is corrected inwardly, so the front end is brought into alignment with the open end of the lance flexure space 237. Therefore, the lance check pin 215 can be positively inserted into the lance flexure space 237.

If the metal terminal 233 in the connector 230 is in the proper inserted position, where it engages with and is retained against withdrawal by the lance 235, as shown in the upper portion of FIG. 16 and FIG. 17, the lower surface 235a of the lance 235 is flush with the lower surfaces 238a of the metal terminal support portions 238. The surface 235a does not project into the lance flexure space 237 and the upper surfaces 235a and 238a, defined by the lance 235 and the metal terminal support portions 238 of the lance flexure space 237 are parallel to the bottom surface 237a.

Therefore, when the lance check pin 215 is inserted into the lance flexure space 237, it continues to advance without abutting against the lance 235. When the connector 230 is completely inserted into the hood portion 213, the movement of the lance check pin 215 relative to the connector 230 is stopped. The front end portion of the pin 215 is positioned beneath the lance 235.

Even if the insertion direction of the lance check pin 215 into the lance flexure space 237 is upwardly inclined or if the lance check pin 215 curves upwardly, the lance check pin 215 is snugly inserted into the lance flexure space 237. Any inclined insertion directions and curved configurations are corrected. Therefore, the lance check pin 215 will not be accidentally caught by the front end of the lance 235 due to an irregular insertion direction or deformation of the lance check pin 215.

When the lance check pin 215 is kept in the lance flexure space 237, the lance check pin 215 is maintained in a fully inserted position by the compression spring 216. The electric contact member 217 is also maintained in a fully inserted position. The front end of the electric contact member 217 contacts and electrically connects to the front end of the metal terminal 233. As a result, the conduction examination circuit confirms that the metal terminal 233 is in its proper position and is correctly mounted in the cavity 232.

If the metal terminal 233 does not reach the proper insertion position and is instead positioned in an improper insertion position, as shown in the lower portion of FIG. 16, the front end portion of the lance 235 is urged downwardly by the metal terminal 233. The lance 235 projects substantially into the lance flexure space 237. The front end of the lance check pin 215, as it is inserted into the lance flexure space 237 when the connector 230 is set in the hood portion 213, abuts against the front end of the lance 235 before it is brought into the position beneath the lance 235. Even if the amount of projecting of the lance 235 is small, there is little chance that the lance check pin 215 will slip beneath the lance 235, since the lance check pin 215 is snugly inserted in the lance flexure space 237.

The lance check pin 215 abuts against the lance 235 and is prevented from being further inserted into the lance flexure space 237 during the positioning of the connector 230. The slider 214 compresses the compression spring 216 and is urged to the left (in FIG. 16) relative to the connector housing 211. The electric contact member 217, which is integral with the slider 214, is thus also urged to the left. As a result, the contact member 217 is unable to contact the metal terminal 233, and an electrical connection between the contact member 217 and metal terminal 233 is not obtained. Thus, the conduction examination circuit detects an abnormal condition, where the metal terminal 233 is not inserted into the proper position or is not inserted into the proper cavity 232.

When the lance 235 is pressed into the lance flexure space 237, the front end of the lance check pin 215 abuts against the lance 235. An insertion resistance is produced when setting the connector 230 in the hood portion 213 and is increased upon further insertion. However, the setting of the connector can be continued because the lance check pin 215 is urged to the left (in FIG. 16) by compressing the compression spring 216. An excessive pressure will not act on the lance 235, thus preventing the lance 235 from being damaged.

Thus, when the metal terminal 233 is attached in the proper insertion position, the lance 235 does not project into the lance flexure space 237, and the lance check pin 215 is prevented from accidentally abutting against the lance 235. Therefore, misdetermination concerning the inserted condition of the metal terminal 233 will not be made.

The lance check pin 215 is snugly inserted into the lance flexure space 237 and abuts against the lance 235 projected into the lance flexure space 237 when the metal terminal 233 is not in the proper insertion position. Therefore, a misdetermination that the metal terminal 233, is in the proper insertion position is not made. Thus, in this third preferred embodiment, a highly reliable correction and insertion examination can be obtained.

Further, in this third preferred embodiment, the lance 235 does not project into the lance flexure space 237 when the metal terminal 233 is properly positioned. The lance check pin 215 is designed to have a simple uniform square cross-section shape over its entire length. Therefore, a mold for molding the lance check pin 215 has a simplified shape and the overall cost can be reduced. Also, dimensional accuracies can be enhanced.

In this third preferred embodiment, each of the electric contact members 217 is connected to the conduction examination circuit for the wire harness. When the connector 230 is inserted into the connection housing 211, the insertion examination (that is, confirmation of the position of the lance 235) for determining whether or not the metal terminal 233 is in the proper insertion position, and the conduction examination for determining whether or not the metal terminal 233 is in the proper cavity 232, are carried out at the same time by a single operation. The examination operation is thus very efficient.

In this third preferred embodiment, the slider 214 in each of the cavities 212 and the lance check pin 215 and the electric contact member 217 are integrally provided as a single unit. Therefore, it is necessary to provide only as many units as there are metal terminals 233 of the connector 230 to be examined. Any change of connector type can be readily dealt with. In the event of a malfunction, it is necessary only to exchange the single unit, therefore obtaining an excellent maintenance performance.

Embodiment 4

Figure 20:
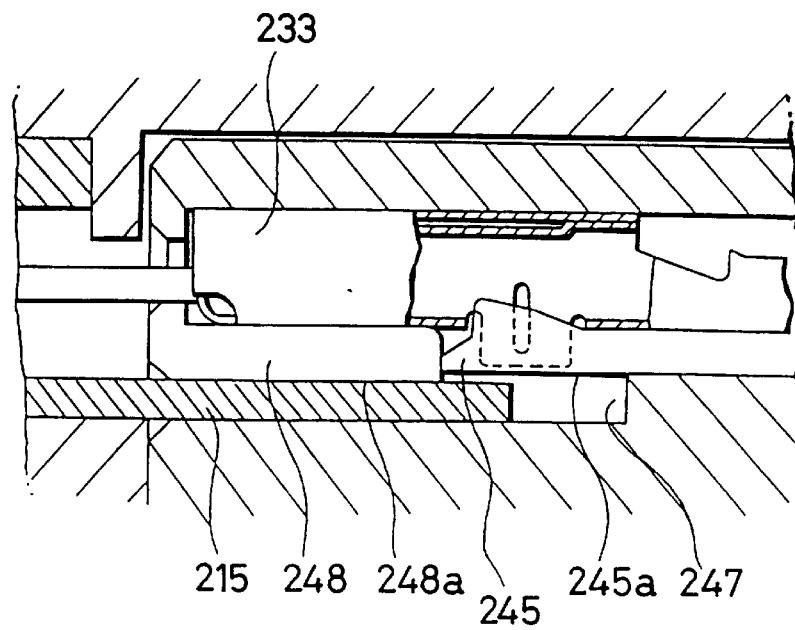
FIG. 20 is a cross sectional view showing a position during an examination of a fourth embodiment of the invention.

FIG. 20 shows a fourth preferred embodiment of the connection examination device 210 and the corrector 230. As shown in FIG. 20, a lower surface 245a of a lance 245, which retains the properly inserted metal terminal 233 against withdrawal, is disposed at a level higher than the lower surface 248a of each metal terminal support portion 248. To achieve this positioning, the thickness of the metal terminal support portion 248 can be increased with respect to the connector 230 of the third preferred embodiment. Alternately, the thickness of the lance 245 can be decreased. The other elements and arrangements are the same as in the third preferred embodiment and therefore further explanation of these elements and arrangements is omitted.

In operation, when the metal terminal 233 is in the proper insertion position, the lance 245 retains the metal terminal 233 against withdrawal. The lance lower surface 245a is positioned at a level higher than the lower surface 248a of each metal terminal support portion 248. Therefore, the lance flexure space portion adjacent the lance 245 is larger in an upward direction than the portion of the lance 245 facing the metal terminal support portion 248. The lance check pin 215, when inserted into the lance flexure space 247, is thus more easily inserted beneath the lance 245.

At this time, the lower surface 245a of the lance 245 is at the level above the lower surface 248a of each metal terminal support portion 248. Therefore, even if the metal terminal 233 is improperly engaged so the lance 245 is displaced downwardly from its proper position, there is little chance that the lance 245 projects downward beyond the metal terminal support portions 248. Thus, the lance check pin 215 is positively prevented from accidentally abutting against the lance 245. However, when the metal terminal 233 is disposed in an improper insertion position, the front end portion of the lance 245 is urged downwardly by the metal terminal 233 beyond the metal terminal support portions 248. The lance 245 sufficiently projects into the lance flexure space 247 so the lance check pin 215 abuts the front end of the lance 245.

In this fourth preferred embodiment, as in the third preferred embodiment, when the metal terminal 233 is in the proper insertion position, the lance 245 does not project into the lance flexure space 247 beyond the metal terminal support portions 248. The lance check pin 215 is prevented from accidentally abutting against the lance 245. Therefore, a misdetermination that the metal terminal 233 is in an improper insertion condition is avoided. When the lance check pin 215 is snugly inserted into the lance flexure space 247 and the metal terminal 233 is not in the proper insertion position, the lance check pin 215 still positively abuts against the lance 245 projected into the lance flexure space 247. Therefore, misdetermination that the metal terminal 233 is in the proper insertion position is also avoided. Thus, a highly reliable examination is carried out.

Embodiment 5

Figure 21:
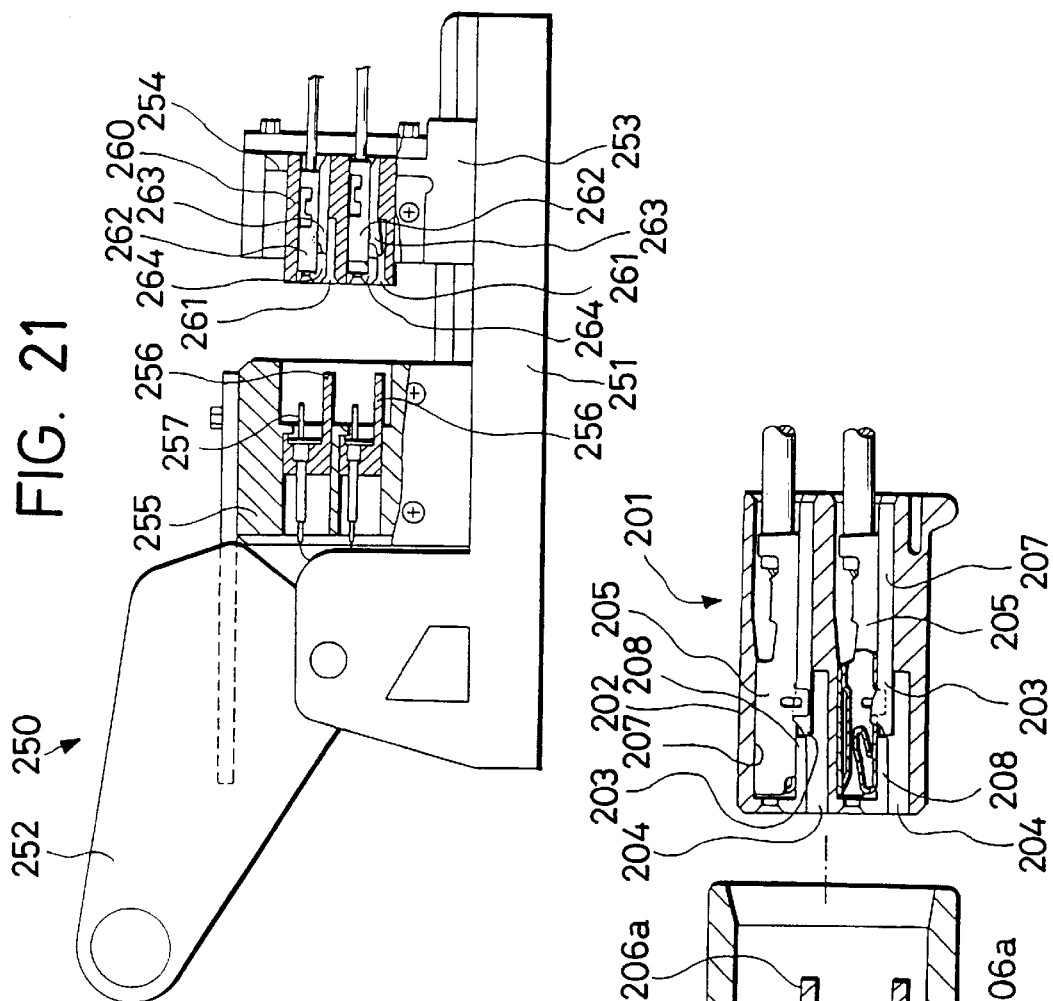
FIG. 21 is a cross sectional view of a fifth embodiment of the invention.
Figure 22:
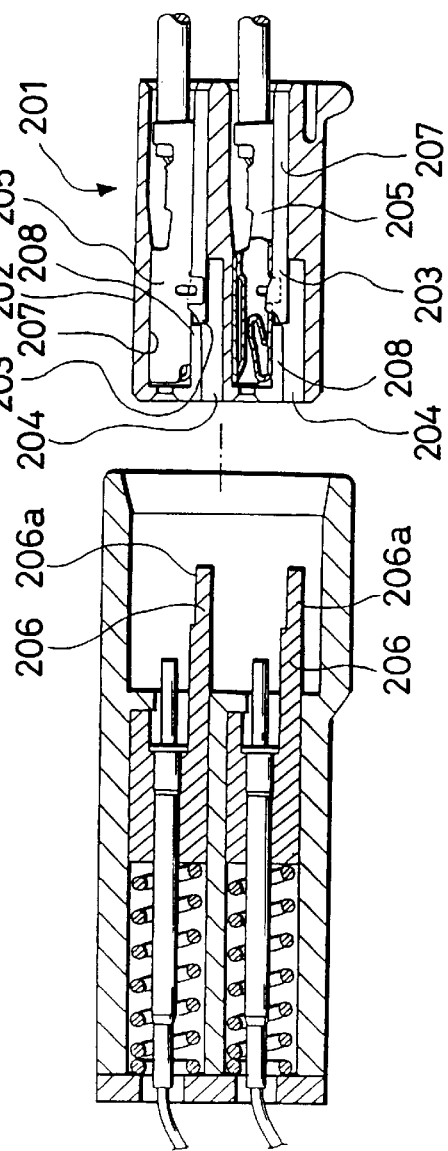
FIG. 22 is a cross sectional view of a conventional connector examination device showing a condition before an examination.
Figure 23:
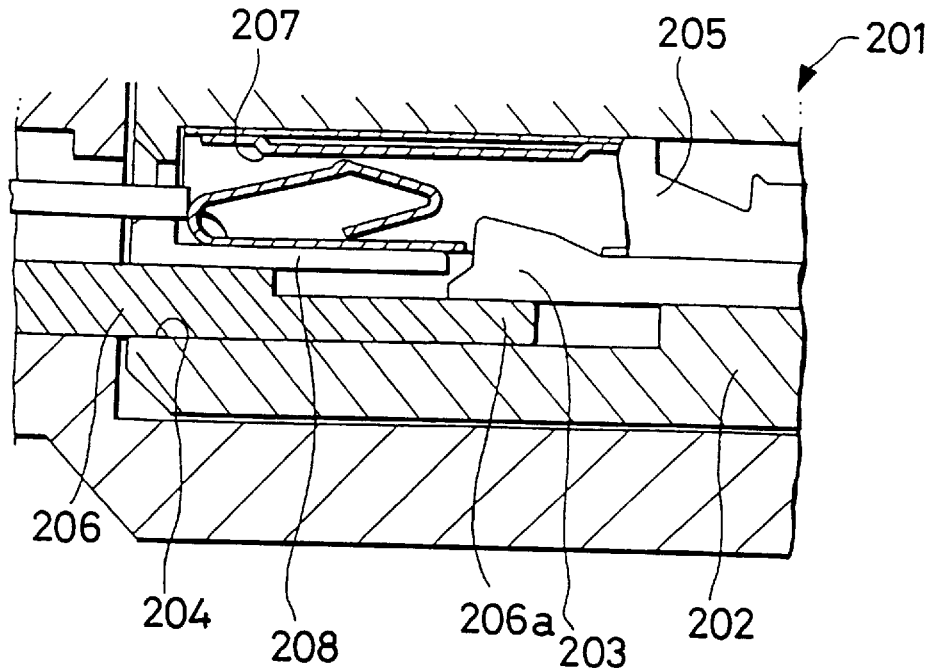
FIG. 23 is a cross sectional view of a portion of the conventional connector examination device showing a condition in which the examination can be properly conducted.
Figure 24:
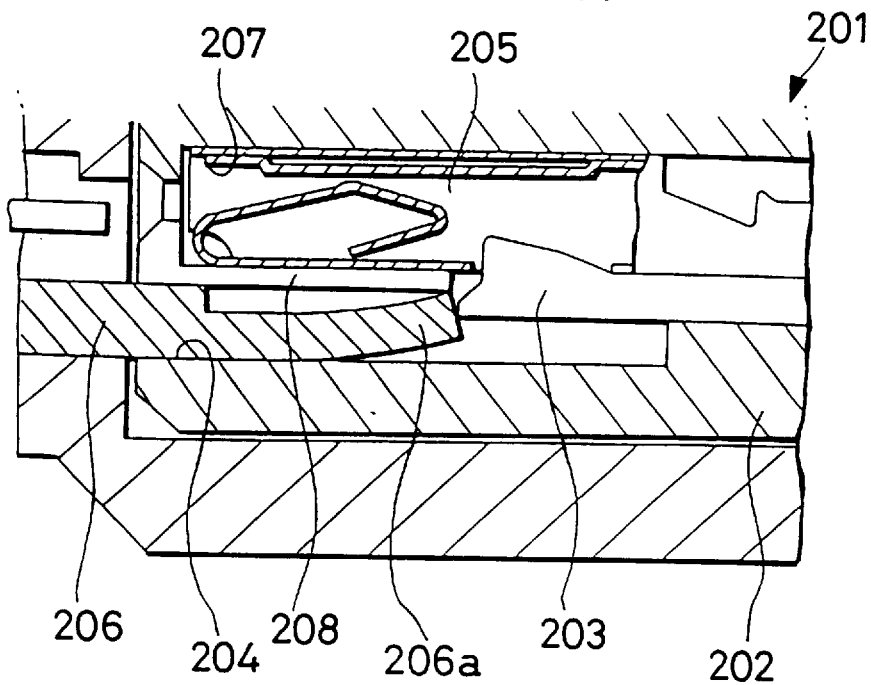
FIG. 24 is a cross sectional view of a portion of the conventional connector examination device showing a condition in which the examination cannot be properly conducted.

FIG. 21 shows a fifth preferred embodiment of the correction examination device 250. As shown in FIG. 21, a housing 255 for the examination device 250 is mechanically moved toward a connector 260. The other elements and arrangements are the same as that of the third preferred embodiment. Thus an explanation of those elements and arrangements is omitted.

The housing 255 is movable by pivotably moving a cam handle 252 on a base plate 251 in a lateral direction. The lance check pins 256 and the electric contact members 257 are similar to those of the third preferred embodiment.

A U-shaped connector holder 253 is fixedly mounted on one end portion of the base plate 251. Protuberances (not shown) are formed on the outer surface of the connector 260 and fit in the fixing grooves 254 in the connector holder 253 when the connector 260 is vertically inserted into the connector holder 253, thereby holding the connector 260 against movement.

In this fifth preferred embodiment, the connector 260 is positioned in the connector holder 253 and the cam handle 252 is pivoted to move the housing 255. As a result, the lance check pins 256 and the electric contact members 257 are moved toward the connector 260. Each lance check pin 256 enters a lance flexure space 261 and the electric contact member 257 is moved toward a metal terminal 262. Therefore, as in the third preferred embodiment, an insertion examination for the metal terminal 262 and a conduction examination for a wire harness can be carried out.

In this fifth preferred embodiment, as in the third preferred embodiment, when the metal terminal 262 is in a proper insertion position, the lance 263 does not project into the lance flexure space 261 beyond the metal terminal support portions 264. The lance check pin 256 is thus prevented from accidentally abutting against the lance 263. Therefore, a misdetermination that the metal terminal 262 is in an improperly inserted condition is avoided. The lance check pin 256 is snugly inserted into the lance flexure space 261. The lance check pin 256 positively abuts against the lance 263, which is deflected into the lance flexure space 261 when the metal terminal 262 is not in the proper insertion position. Therefore, a misdetermination that the metal terminal 262 is in the proper insertion position is also avoided. Therefore, a highly reliable examination is carried out.

In this fifth preferred embodiment, although the housing 255 is pivotably moved by the cam handle 252, the housing 255 may be fixed while the connector holder 253 is movable. Alternatively, both may move toward each other at the same time.

In this fifth preferred embodiment, although the detection means for determining from the position of the lance check pin 256 whether or not the lance check pin 256 is abutted against the lance 263 comprises the electric contact member 257 which moves with the lance check pin 256 to contact the metal terminal 262 when it is in the proper insertion position, the detection means of this fifth preferred embodiment is not limited to this electric contact member 257. The detection means may include any other suitable means.

Additionally, this fifth preferred embodiment is not limited to the structure and features described above. For example, although the insertion condition of each metal terminal 262 is examined by the lance check pin 256, this fifth preferred embodiment is applicable to a connector having a retainer inserted into a connector housing from a front side. The retainer engages lances to prevent each lance from being elastically deformed toward a lance flexure space, preventing withdrawal of a metal terminal, thus achieving a so-called "double-retaining" function. In this situation, when each engagement member of the retainer, when engaging a lance, is inserted into the lance flexure space, each engagement member is prevented from accidentally abutting against a lance which is retaining the corresponding metal terminal in the proper insertion position. Each engagement member is also prevented from accidentally being inserted beneath the lance when the lance is deflected into the lance flexure space when the corresponding metal terminal in an improper insertion position.

Embodiment 6

Figure 29:
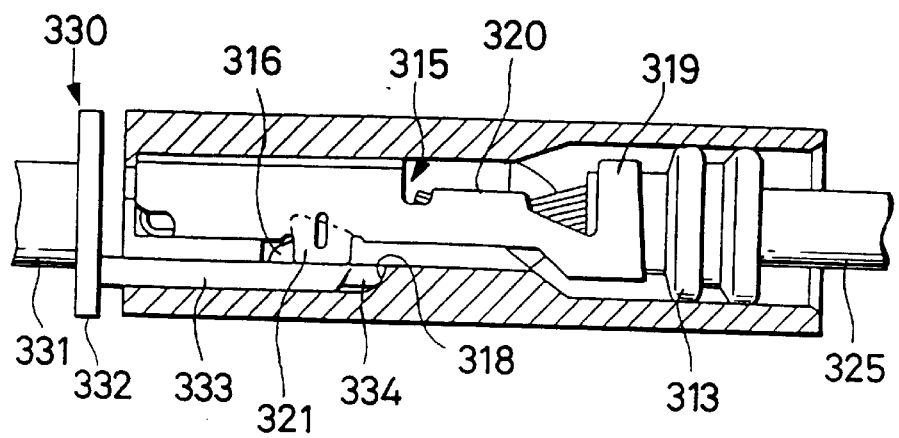
FIG. 29 is a cross sectional view of the sixth embodiment showing a metal terminal in a proper position.
Figure 30:
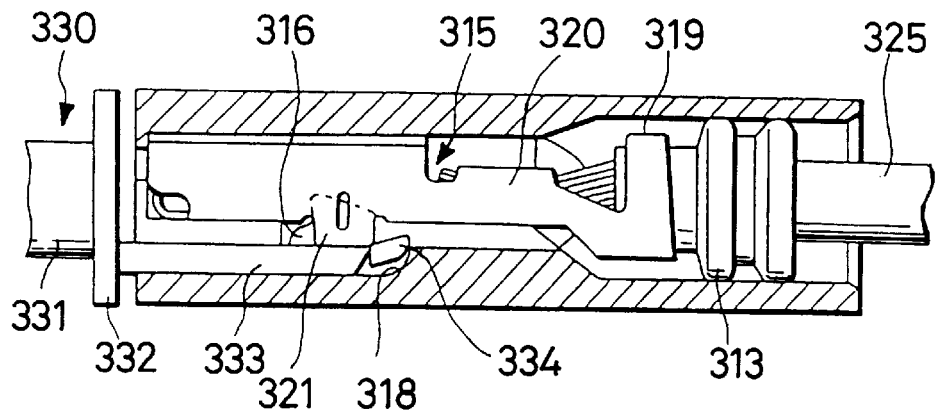
FIG. 30 is a cross sectional view of the sixth embodiment showing the metal terminal in the proper position.

A sixth embodiment of the connection examination device, comprising a hand operated examination jig, is shown in FIGS. 25 to 32. As shown in FIG. 25, a connector 310 has a connector housing 311 which is molded from a synthetic resin into a generally flat, tubular configuration. Two juxtaposed cavities 312 are formed in the connector housing 311. Each cavity 312 is open at a front and a rear end. A waterproof tubular portion 314, for receiving a rubber waterproof plug 313 as shown in FIG. 29, is formed integrally with and extends from the cavity portion 312. A metal terminal 315 is inserted into the cavity 312 from the rear end of the connector housing 311. The lances 316, which prevent the associated metal terminal 315 against being withdrawn, are formed integrally on the connector housing 311.

Each lance 316 is an elastically-deformable, elongated projection. Each lance 316 has a retaining portion 316a adjacent to a front end of the lance 316. A lance flexure space 317 is provided in the cavity 312 and allows a downward elastic deformation of the lance 316. The metal terminal 315 is a female terminal having a well-known construction and is mated with a metal male terminal of a mating connector (not shown). The metal terminal 315 includes an insulation barrel portion 319 which clamps onto a covering of a wire 325 and the waterproof rubber plug 313, a wire barrel portion 320 for clamping onto a conductive portion of the wire 325, and a pair of stabilizers 321 for engaging opposite sides of the lance 316, such that the lance 316 is held between the stabilizers 21. When each metal terminal 315 is inserted into the associated cavity 312, the front end of the metal terminal 315 abuts against the lance 316 to elastically deform the lance 316 into the lance flexure space 317. When the metal terminal 315 is inserted into a forwardmost position in the cavity 312, the lance 316 is elastically deformed and meets an engagement hole (not shown) in the metal terminal 315. The lance 316 is then restored into its initial position, so that the retaining portion 316 is engaged in this engagement hole. The metal terminal 315 is thus retained against being withdrawn, with the stabilizers 321 positioned on opposite sides of the lance 316.

Figure 32:
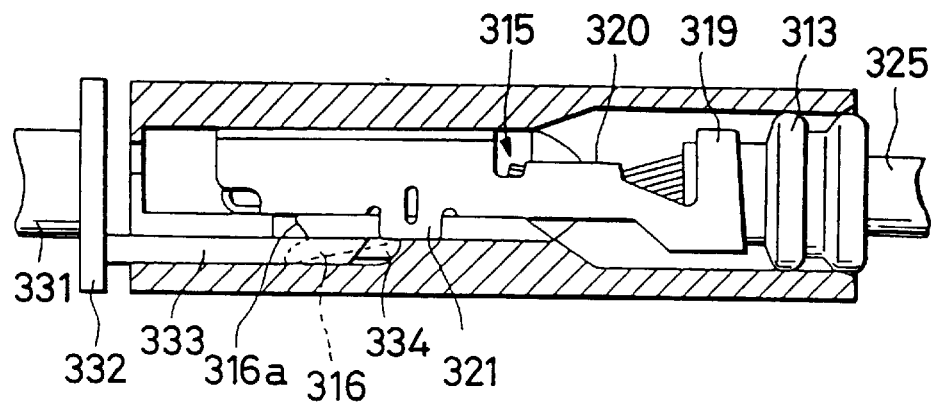
FIG. 32 is a cross sectional view of the sixth embodiment showing the metal terminal in a position short of the proper position.

The position where the metal terminal 315 engages with the lance 316 is the proper insertion position. FIG. 29 shows the position of the metal terminal 315 when it is inserted into the proper insertion position and is completely engaged with the lance 316. FIG. 32 shows one position of the metal terminal 315 when it is inserted to a position short of the proper insertion position and elastically deforms the lance 316 into the lance flexure space 317. A guide wall portion 318, which is an arcuately upwardly curved surface, is formed on a bottom surface of the lance flexure space 317 at the inner end of the lance flexure space 317.

The examination jig 330, as shown in FIG. 25 is entirely molded of a synthetic resin and has an integral construction. More specifically, an end plate 332 is secured at an end of a handle 331 and extends perpendicularly to the handle 331. Two pairs of check pins 333, corresponding to the cavities 312, are formed on and project from the end plate 332. Each pair of check pins 333 corresponds to a respective one of the cavities 312 and are constructed in a bifurcated manner. Each pair of check pins 333 is inserted into an associated lance flexure space 317 in the connector housing 311. A dimension a as shown in FIG. 25, is the length between the outer side surfaces of each pair of check pins 333, is slightly smaller than a dimension between the side walls of the lance flexure space 317. The pair of check pins 333 are guided by the opposed side walls when being inserted into the lance flexure space 317. The distance b is the distance between the inner side surfaces of the pair of check pins 333, and is slightly larger than the width of the lance 316, so the pair of check pins bracket but do not contact the lance 316.

Figure 27:
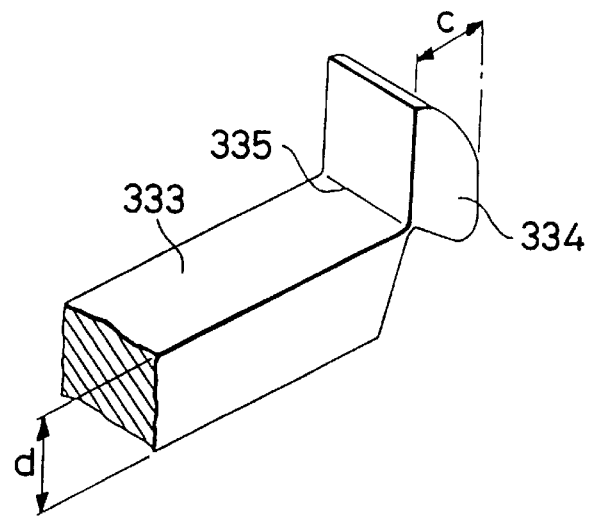
FIG. 27 is an perspective view showing a front end portion of a check pin.
Figure 28:
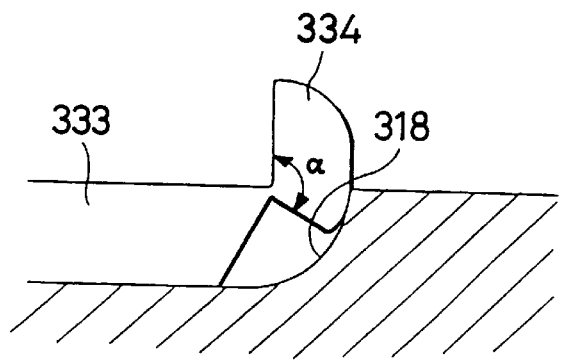
FIG. 28 is a cross sectional view of the sixth embodiment showing the front end portion.

A check portion 334 is pivotably connected by a self-hinge portion 335 to the distal end of each check pin 333. The self-hinge portion 335 is provided on an upper surface portion of the check pin 333. The self-hinge portion 335 allows the check portion pivotably moved upwardly, as shown in FIG. 27. A distal end of the check portion 334 has a smooth arcuate configuration conforming to the curved guide wall 318 formed at the inner end of the lance flexure space 317. As shown in FIG. 27, the thickness c of the check portion 334 is smaller than a thickness d of the check pin 333 (c<d). The interface between the check pin 333 and the check portion 334 is slantingly downwardly toward the inlet of the lance flexure space 317. An angle α between the contact surface and the upper surface of the check portion 334 is not less than 90°.

In operation, the metal terminals 315 are each clamped to one end of the wire 325 before being inserted into the cavities 312 in the connector housing 311. The operator holds the connector housing 311 with one hand, grips the handle 331 of the examination jig 330 with the other hand, and inserts the check pins 333 into the lance flexure spaces 317 from the front side of the connector housing 311.

Figure 31:
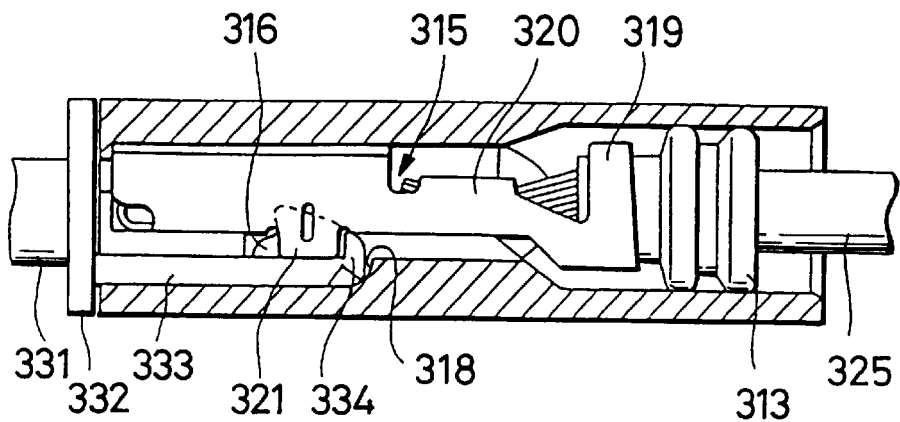
FIG. 31 is another cross sectional view of the sixth embodiment showing the metal terminal in the proper position.

Assuming that the metal terminal 315 is inserted into the proper insertion position of the cavity 312, the check pins 333 enter the lance flexure space 317. The check portion 334 at the distal end of the check pin 333 abuts against the guide wall portion 318 at the inner end of the lance flexure space. At this point, the check portions 334 are positioned to one side of the stabilizers 321 of the metal terminal 315, as shown in FIG. 29. Therefore, when the check pins 333 are further inserted, the check portion 334 previously abutting against the guide wall portion 318 is pivotably moved along the curved surface of the guide wall portion 318 toward the stabilizer 321 to avoid the stabilizer 321. As a result, the check pins 333 are further inserted until the end plate 332 finally abuts against the open end of the connector housing 311. This position is shown in FIG. 31.

In this position, because the angle α, between the surface of the check portion 334 contacting the check pin 333 and the upper surface of the check portion 334 is not less than 90°, the check portion 334 will not come out of the lance flexure space 317 entirely. When the check pins 333 are withdrawn from the lance flexure space 317, the check portion 334 is pivotably moved to engage the stabilizer 321, so the check portion 334 is automatically returned to its initial position. Therefore, the check portion 334 will not be caught by an upper edge of the guide wall portion 318.

On the other hand, if the metal terminal 315, when inserted in the cavity 312, is not positioned in the proper insertion position, as shown in FIG. 32, the check portion 334 at the inner end of the lance flexure space 317 tends to pivotably move upwardly and abut against the stabilizer 321. This prevents any further insertion of the check pins 333. Therefore, the end plate 332 can not be brought into contact with the open end of the connector housing 311, and a gap is formed between the end plate 332 and the connector housing 311.

In the examination jig 330, the check pins 333 are inserted into the lance flexure spaces 317 and the maximum depth of the insertion thereof is judged. By this process, whether or not each of the metal terminals 315 are in the proper insertion position can be accurately determined. During the examination process, the check pins 333 and the check portions 334 will not contact the lance 316 and will not damage the lance 316. Therefore, the connector 330 is positively prevented from being damaged. Furthermore, the examination jig 330 is molded of a synthetic resin and has an integral construction, so that each check portion 334 is connected to the check pin 333 through the self-hinge portion 335. Even if these portions are formed into a compact design, the examination jig 330 can be precisely produced at low costs. A highly accurate examination can be effected with this compactly designed connector.

Embodiment 7

Figure 33:
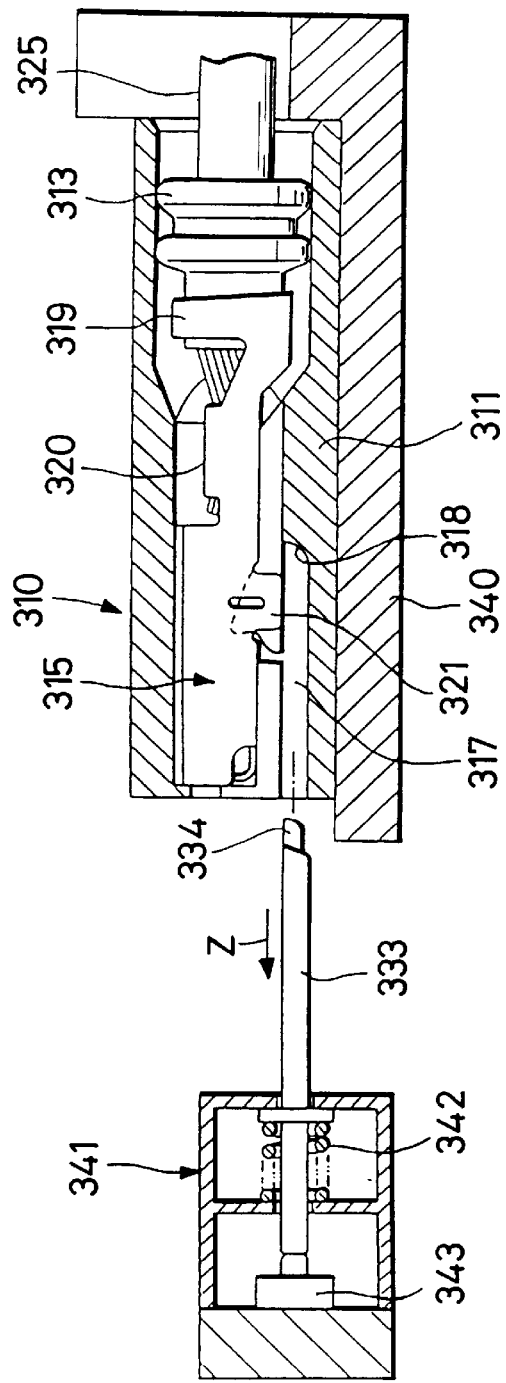
FIG. 33 is a cross sectional view of a seventh embodiment of the invention.

FIG. 33 shows an examination device according to a seventh preferred embodiment of this invention. Those portions identical to those of the sixth preferred embodiment are designated by identical reference numerals, respectively, and any further description is omitted. The connector 310 is removably held on a connector holder 340. The check pins 333 are mounted on a check pin holder 341. The connector holder 340 and the check pin holder 341 can be moved a predetermined distance toward each other by operating a handle (not shown). In this seventh preferred embodiment, the connector holder 340 is fixedly mounted on a base plate (not shown) while the check pin holder 341 is slidably movable over this base plate. The compression springs 342 normally urge the check pins 333 toward the connector holder 340 and are provided within the check pin holder 341. The check pins 333 move in direction Z when pushed, and compress the associated compression spring 342, so that a switch 343 is closed.

As shown in FIG. 33, the connector housing 311 of the connector 310 is set in the connector holder 340. The handle of the examination device is operated to move the check pin holder 341 toward the connector 310. The check pins 333 are then inserted into the corresponding lance flexure spaces 317 in the connector housing 311. At this time, if each metal terminal 315 is in the proper insertion position, each check pin 333 is inserted as in the sixth preferred embodiment. If a metal terminal is not in the proper insertion position, the advance of the corresponding check pin 333 stops at less than the desired position. If the amount of movement of the check pin holder 341 is equal to the amount of advance of the check pin 333 when each metal terminal 315 is in the proper insertion position, the compression spring 342 is not compressed. In contrast, if the metal terminal 315 is not in the proper insertion position, the advance of the associated check pin 333 stops at less than the desired position. The check pin holder 341 is further moved so the check pin 333 moves in the direction of the arrow Z, compressing the associated compression spring 342 and closing the switch 343. Based on an electrical signal from the switch 343, it is determined whether or not the metal terminal 315 is disposed in the proper position.

Embodiment 8

Figure 34:
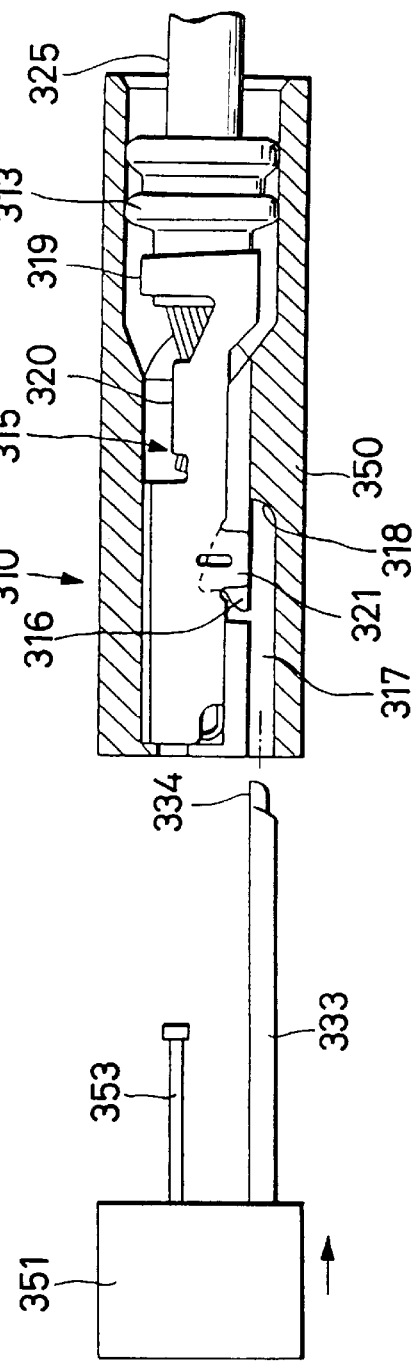
FIG. 34 is a cross sectional view of an eighth embodiment of the invention.

FIG. 34 shows an installation type according to an eighth preferred embodiment of this invention. Those portions identical to those the sixth preferred embodiment are designated by identical reference numerals and a further description is omitted. In this embodiment, as in the seventh preferred embodiment, the connector 310 is removably held on a connector holder 350 and the check pins 333 are mounted on a check pin holder 351. By operating a handle (not shown), the check pin holder 351 is movable toward the connector holder 350, which is fixedly mounted on a base plate. The check pins 333 can be inserted into corresponding lance flexure spaces 317 in the connector housing 311. The compression springs (not shown), which normally urge the check pins 333 toward the connector holder 350, are provided within the check pin holder 351. The probes 353 which contact the corresponding metal terminals 315 in the cavity 312 project in a parallel relationship to the check pins 333.

Figure 35:
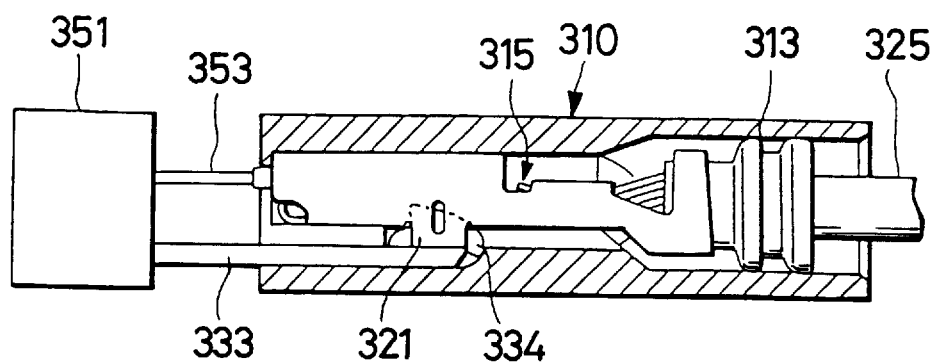
FIG. 35 is a cross sectional view of the eighth embodiment showing a metal terminal in a proper position.
Figure 36:
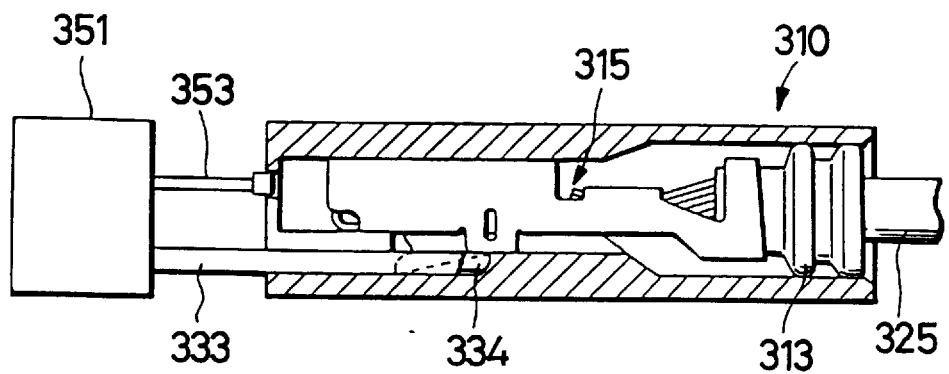
FIG. 36 is a cross sectional view of the eighth embodiment showing the metal terminal in an improper position.

As shown in FIGS. 34–36 the connector housing 311 of the connector 310 is set in the connector holder 350. The handle of the examination device is operated to move the check pin holder 351 toward the connector 310. The check pins 333 are then inserted into the corresponding lance flexure spaces 317 in the connector housing 311. At this time, if each metal terminal 315 is in the proper insertion position, each check pin 333 is inserted as in the sixth preferred embodiment. If a metal terminal is not in the proper insertion position, the advance of the check pin 333 stops at less than the desired position. If the amount of movement of the check pin holder 351 is equal to the amount of advance of the check pin 333 when each metal terminal 315 is in the proper insertion position, the check pin 333 advances into the proper insertion position of the metal terminal 315. Therefore, the probe 353 is brought into contact with the metal terminal 315, as shown in FIG. 35. In contrast, if the metal terminal 315 is not in the proper insertion position, the advance of the associated check pin 333 stops at less than the desired position, and the probe 353 does not contact the metal terminal 315, as shown in FIG. 36.

Therefore, in this eighth preferred embodiment, based on an electrical signal from a switch, it is determined whether or not the metal terminal 315 is in the proper insertion position. At the same time, by the use of the probe 353, a wire harness examination can be advantageously carried out to determine whether or not each metal terminal is inserted in the associated proper cavity 312 in the connector housing 311.

While this invention has been described with reference to specific embodiments, it is not confined to the specific details set forth, but is intended to cover such modifications or changes as may come within the scope of the following claims.

What is claimed is:

1. A connector examining system for examining a connector, at least one terminal member being inserted into the connector, the connector examining system comprising:

a base having a first end and a second end;

a handle secured to the first end of the base; and at least one lance check pin extending from the second end of the base and insertable into the connector, the at least one lance check pin including a base portion and a deformable lance check pin portion that is pivotable about the base portion, the deformable lance check pin portion pivoting about the base portion such that the second end of the base is adjacent the connector when the at least one terminal member is inserted properly into the connector, the deformable lance check pin portion engaging the at least one terminal member such that the second end of the base is separated from the connector by a gap when the at least one terminal member is not inserted properly into the connector.

2. The connector examining system of claim 1, wherein the deformable lance check pin portion is located at an end of the lance check pin, the deformable lance check pin portion having a curved end surface, the deformable lance check pin portion attached to the lance check pin by a self-hinge portion.

3. The connector examining system of claim 1, wherein the connector comprises:

a housing having a plurality of surfaces;

at least one lance flexure space provided on the housing and having an opening; and at least one elastically deformable lance, each lance corresponding to each of the at least one lance flexure space, each lance normally positioned outside of the corresponding lance flexure space;

wherein the at least one lance check pin is insertable into the at least one lance flexure space, wherein each of the at least one terminal member deforms the corresponding lance into the corresponding lance flexure space when the corresponding terminal member is not in a proper terminal connection position and the corresponding lance returns to the normal position when the corresponding terminal member is in the proper terminal position, and wherein when the corresponding terminal member is in the proper terminal connection position, the lance is in the normal position and the corresponding lance check pin is fully insertable into the corresponding lance flexure space and when the corresponding terminal member is not in the proper terminal connection position, the corresponding lance is deformed into the corresponding lance flexure space such that the corresponding lance check pin abuts the deformed lance and is not fully insertable into the corresponding lance flexure space.

4. The connector examining system of claim 3, wherein the at least one lance flexure-space has an upwardly curved surface.

5. The connector examining system of claim 3, wherein each lance flexure space comprises a curved surface at an end remote from the opening and the curved end surface of each deformable lance check pin portion contacts the curved surface of the corresponding lance flexure space and is deformed by the curved surface when the terminal member is in the proper terminal position.

6. The connector examining system of claim 5, wherein each terminal member comprises stabilizers positionable on opposite sides of the corresponding lance when at least one lance is in the proper terminal connection position, and wherein the curved end piece of the deformable lance check pin portion contacts the stabilizers when the corresponding terminal member is not in the proper terminal connection position.

7. The connector examining system of claim 1, wherein the at least one lance check pin is completely inserted into the connector when the at least one lance check pin engages the at least one terminal member.

* * * * *